(12) United States Patent
Nishimura

(10) Patent No.: US 11,222,935 B2
(45) Date of Patent: Jan. 11, 2022

(54) LIGHT-EMITTING PANEL, ELECTRONIC APPARATUS, AND METHOD OF MANUFACTURING LIGHT-EMITTING PANEL

(71) Applicant: JOLED Inc., Tokyo (JP)

(72) Inventor: Masaki Nishimura, Tokyo (JP)

(73) Assignee: JOLED INC., Tokyo (JP)

( * ) Notice: Subject to any disclaimer, the term of this patent is extended or adjusted under 35 U.S.C. 154(b) by 21 days.

(21) Appl. No.: 16/532,496

(22) Filed: Aug. 6, 2019

(65) Prior Publication Data

US 2020/0052052 A1 Feb. 13, 2020

(30) Foreign Application Priority Data

Aug. 7, 2018 (JP) .............................. JP2018-148644
Jul. 19, 2019 (JP) .............................. JP2019-133798

(51) Int. Cl.
*H01L 27/32* (2006.01)
*H01L 51/00* (2006.01)
*H01L 51/50* (2006.01)

(52) U.S. Cl.
CPC ...... *H01L 27/3246* (2013.01); *H01L 51/0004* (2013.01); *H01L 27/3211* (2013.01); *H01L 51/5012* (2013.01); *H01L 2251/558* (2013.01)

(58) Field of Classification Search
CPC .......................... H01L 27/3211; H01L 27/3246
See application file for complete search history.

(56) References Cited

U.S. PATENT DOCUMENTS

| 2002/0064966 A1 | 5/2002 | Seki et al. |
| 2010/0214195 A1* | 8/2010 | Ogasawara ....... G02F 1/136286 345/55 |
| 2019/0363139 A1* | 11/2019 | Nishioka ............. H01L 27/3246 |

FOREIGN PATENT DOCUMENTS

| JP | 2002-222695 A | 8/2002 | |
| JP | 2008-216357 A | 9/2008 | |
| WO | 2009/057342 A1 | 5/2009 | |
| WO | WO-2012132862 A1 * | 10/2012 | ............. H05B 33/02 |

OTHER PUBLICATIONS

English translation of WO2012132862 provided by WIPO and Google translate. (Year: 2012).*

\* cited by examiner

*Primary Examiner* — Stephen M Bradley
(74) *Attorney, Agent, or Firm* — Xsensus LLP

(57) ABSTRACT

A light-emitting panel includes a plurality of pixels, a plurality of first regulators, and a plurality of second regulators. The plurality of first regulators extends in a first direction and defines each two of the pixels that are adjacent to each other in a second direction orthogonal to the first direction. The plurality of second regulators extends in the second direction and defines each two of the pixels that are adjacent to each other in the first direction. The plurality of pixels at least includes a first pixel and a second pixel that have different lengths in the first direction from each other and share a light-emitting layer. The first pixel and the second pixel are at least adjacent to each other in the first direction with the second regulator being interposed between the first pixel and the second pixel.

13 Claims, 24 Drawing Sheets

LIGHT-EMITTING PANEL, ELECTRONIC APPARATUS, AND METHOD OF MANUFACTURING LIGHT-EMITTING PANEL

CROSS REFERENCE TO RELATED APPLICATIONS

This application claims the benefit of Japanese Priority Patent Application No. 2018-148644 filed on Aug. 7, 2018 and Japanese Priority Patent Application No. 2019-133798 filed on Jul. 19, 2019, the entire contents of each of which are incorporated herein by reference.

BACKGROUND

The disclosure relates to a light-emitting panel, an electronic apparatus, and a method of manufacturing a light-emitting panel.

A variety of panels have been proposed as light-emitting panels including light-emitting elements. For example, an organic light-emitting diode (OLED) panel including an organic material as a light-emitting element has been launched. Such OLED panels are disclosed in, for example, International Publication No. WO 2009/057342, Japanese Unexamined Patent Application Publication (JP-A) No. 2008-216357, and JP-A No. 2002-222695. Moreover, a quantum dot light-emitting diode (QLED) panel in which an inorganic material is used for a light-emitting layer of a light-emitting element is currently under development. For OLED panels and QLED panels, coating is used in forming light-emitting elements.

SUMMARY

Pixels are formed by a coating film in a coating-type light-emitting panel; hence, controlling the thickness of the coating film is important in reducing display unevenness such as luminance unevenness.

It is desirable to provide a light-emitting panel that is able to reduce display unevenness, an electronic apparatus including the light-emitting panel, and a method of manufacturing the light-emitting panel.

A light-emitting panel according to one embodiment of the disclosure includes a plurality of pixels, a plurality of first regulators, and a plurality of second regulators. The plurality of first regulators extends in a first direction and defines each two of the pixels that are adjacent to each other in a second direction orthogonal to the first direction. The plurality of second regulators extends in the second direction and defines each two of the pixels that are adjacent to each other in the first direction. The plurality of pixels at least includes a first pixel and a second pixel that have different lengths in the first direction from each other and share a light-emitting layer. The first pixel and the second pixel are at least adjacent to each other in the first direction with the second regulator being interposed between the first pixel and the second pixel.

An electronic apparatus according to one embodiment of the disclosure includes the light-emitting panel according to one embodiment of the disclosure.

A method of manufacturing a light-emitting panel according to one embodiment of the disclosure includes preparing a panel including a display region, a non-display region provided around the display region, a plurality of pixel formation regions provided in both the display region and the non-display region, a plurality of first regulators that extends in a first direction and defines each two of the pixel formation regions that are adjacent to each other in a second direction orthogonal to the first direction, and a plurality of second regulators that extends in the second direction and defines each two of the pixel formation regions that are adjacent to each other in the first direction, the plurality of pixel formation regions including a first pixel and a second pixel that have different lengths in the first direction from each other, the first pixel and the second pixel being adjacent to each other in the first direction with the second regulator being interposed between the first pixel and the second pixel, and forming a pixel including a light-emitting layer in the pixel formation regions included in the display region and the pixel formation regions included in the non-display region, by applying ink to the display region and the non-display region of the panel.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

Figure 1:
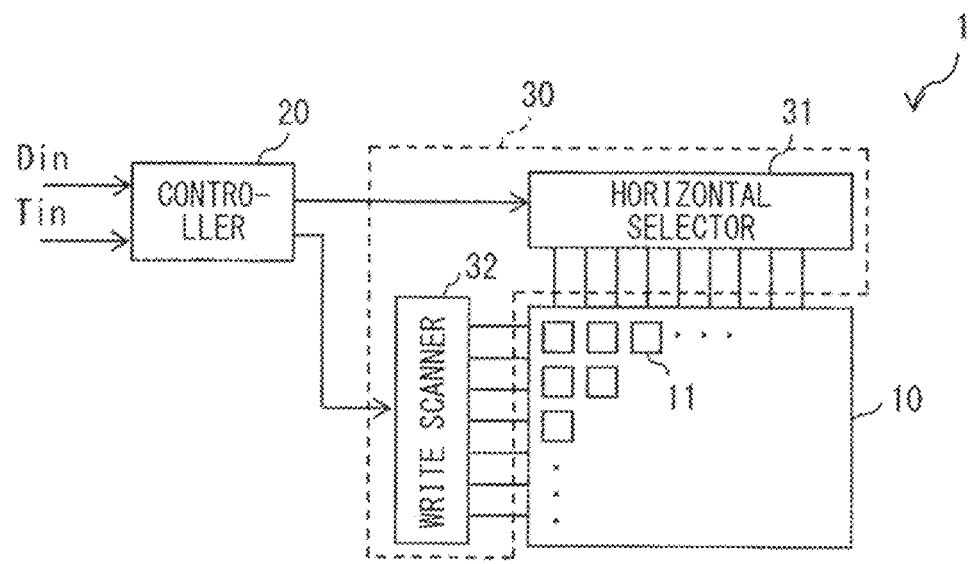
FIG. 1 is a diagram illustrating an example of a schematic configuration of a light-emitting unit according to one embodiment of the disclosure.

In the following, some example embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail.

1. EMBODIMENT

Figure 2:
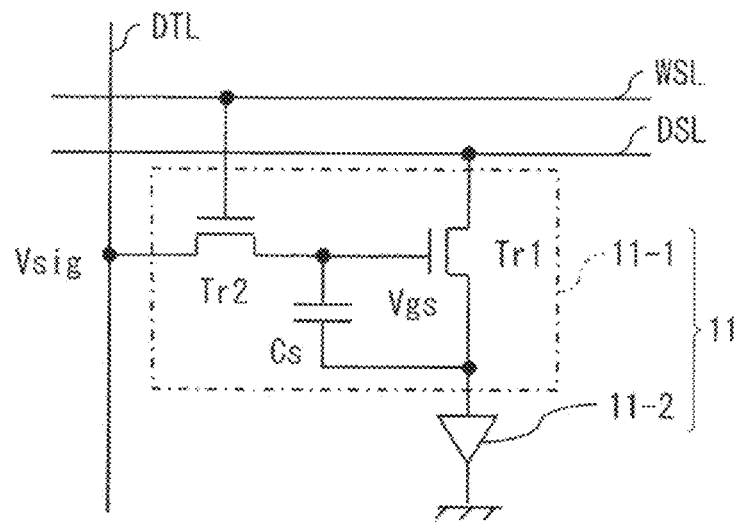
FIG. 2 is a diagram illustrating an example of a circuit configuration of each pixel illustrated in FIG. 1.

[Configuration]
FIG. 1 illustrates an example of a schematic configuration of a light-emitting unit 1 according to an example embodiment of the disclosure. FIG. 2 illustrates an example of a circuit configuration of each pixel 11 provided in the light-emitting unit 1. The light-emitting unit 1 may include, for example, a light-emitting panel 10, a controller 20, and a driver 30. The driver 30 may be mounted on an outer edge portion of the light-emitting panel 10, for example. The light-emitting panel 10 includes a plurality of pixels 11 that may be arranged in matrix. The controller 20 and the driver 30 may drive the light-emitting panel 10 (the pixels 11) on the basis of an external image signal Din and an external synchronizing signal Tin.

[Light-Emitting Panel 10]

In response to the active-matrix driving of the pixels 11 performed by the controller 20 and the driver 30, the light-emitting panel 10 may display an image based on the external image signal Din and the external synchronizing signal Tin. The light-emitting panel 10 may include a plurality of scanning lines WSL extending in a row direction, a plurality of power lines DSL extending in the row direction, a plurality of signal lines DTL extending in a column direction, and the plurality of pixels 11 arranged in matrix.

The scanning lines WSL may be used to select the pixels 11. In one example, the scanning lines WSL may supply the respective pixels 11 with a selection pulse to select the pixels 11 on a predetermined unit basis, for example, a pixel-row basis. The signal lines DTL may be used to supply the respective pixels 11 with a signal voltage Vsig based on the image signal Din. In one example, the signal lines DTL may supply the respective pixels 11 with a data pulse that includes the signal voltage Vsig. The power lines DSL may be used to supply the respective pixels 11 with electric power.

Each of the pixels 11 in the light-emitting panel 10 may include, for example, a pixel 11 emitting red light, a pixel 11 emitting green light, and a pixel 11 emitting blue light. Hereinafter, the pixel 11 emitting red light, the pixel 11 emitting green light, and the pixel 11 emitting blue light will be respectively referred to as a pixel 11R, a pixel 11G, and a pixel 11B. In the plurality of pixels 11, the pixels 11R, 11G, and 11B may constitute a display pixel 12 (see FIG. 3 described below). A color image may be displayed in units of display pixels 12. Note that each of the display pixels 12 may further include a pixel 11 that emits light of another color, such as white or yellow, for example. Each of the display pixels 12 may include pixels 11 of the same color, such as two pixels 11 that emit blue light, for example. Accordingly, the pixels 11 in the light-emitting panel 10 may be grouped into the display pixels 12 each including predetermined number of pixels 11. In each of the display pixels 12, the pixels 11 may be aligned in line along a predetermined direction, such as a row direction, for example.

Each of the signal lines DTL may be coupled to an output terminal of a horizontal selector 31 described below. Each of the signal lines DTL may be allocated to its corresponding pixel column, for example. Each of the scanning lines WSL may be coupled to an output terminal of a write scanner 32 described below. Each of the scanning lines WSL may be allocated to its corresponding pixel row, for example. Each of the power lines DSL may be coupled to an output terminal of a power source. Each of the power lines DSL may be allocated to its corresponding pixel row, for example.

Each of the pixels 11 may include a pixel circuit 11-1 and a light-emitting element 11-2. An example configuration of the light-emitting element 11-2 is described in detail below.

The pixel circuit 11-1 may control light emission and light extinction of the light-emitting element 11-2. The pixel circuit 11-1 may hold a voltage written into the pixel 11 by write scanning described below. The pixel circuit 11-1 may include, for example, a driving transistor Tr1, a switching transistor Tr2, and a storage capacitor Cs.

The switching transistor Tr2 may control application of the signal voltage Vsig to a gate of the driving transistor Tr1. The signal voltage Vsig may correspond to the image signal Din. For example, the switching transistor Tr2 may sample a voltage of the signal line DTL, and may write the sampled voltage to the gate of the driving transistor Tr1. The driving transistor Tr1 may be coupled in series to the light-emitting element 11-2. The driving transistor Tr1 may drive the light-emitting element 11-2. The driving transistor Tr1 may control an electrical current flowing in the light-emitting element 11-2 on the basis of a magnitude of the voltage sampled by the switching transistor Tr2. The storage capacitor Cs may hold a predetermined voltage between the gate and a source of the driving transistor Tr1. The storage capacitor Cs may hold a voltage Vgs between the gate and the source of the driving transistor Tr1 at a constant level for a predetermined period of time. Note that the pixel circuit 11-1 may have the 2Tr1C circuit configuration described above and additional capacitors and transistors. Alternatively, the pixel circuit 11-1 may have a circuit configuration different from the 2Tr1C circuit configuration described above.

Each of the signal lines DTL may be coupled to the output terminal of the horizontal selector 31 described below and the source or drain of the switching transistor Tr2. Each of the scanning lines WSL may be coupled to the output terminal of the write scanner 32 described below and the gate of the switching transistor Tr2. Each of the power lines DSL may be coupled to a power supply circuit and the source or the drain of the driving transistor Tr1.

The gate of the switching transistor Tr2 may be coupled to the scanning line WSL. One of the source or drain of the switching transistor Tr2 may be coupled to the signal line DTL. The other of the source or drain, uncoupled to the signal line DTL, of the switching transistor Tr2 may be coupled to the gate of the driving transistor Tr1. One of the source or drain of the driving transistor Tr1 may be coupled to the power line DSL. The other of the source or drain, uncoupled to the power line DSL, of driving transistor Tr1 may be coupled to an anode 21 of the light-emitting element 11-2. One terminal of the storage capacitor Cs may be coupled to the gate of the driving transistor Tr1. The other end of the storage capacitor Cs may be coupled to one of the source or drain, adjacent to the light-emitting element 11-2, of the driving transistor Tr1. A cathode 27 of the light-emitting element 11-2 may be coupled to a constant-voltage line, such as a ground line.

[Driver 30]

The driver 30 may include, for example, the horizontal selector 31 and the write scanner 32. The horizontal selector 31 may apply an analog signal voltage Vsig received from the controller 20 to each of the signal lines DTL in response to (in synchronization with) an input of a control signal, for example. The write scanner 32 may scan the pixels 11 on a predetermined unit basis.

[Controller 20]

The controller 20 will now be described. The controller 20 may perform a predetermined correction of a digital image signal Din received from an external device, and may generate a signal voltage Vsig on the basis of the corrected image signal. The controller 20 may output the generated signal voltage Vsig to the horizontal selector 31, for example. The controller 20 may output a control signal to each circuit in the driver 30 in response to (in synchronization with) a synchronizing signal Tin received from an external device.

Figure 3:
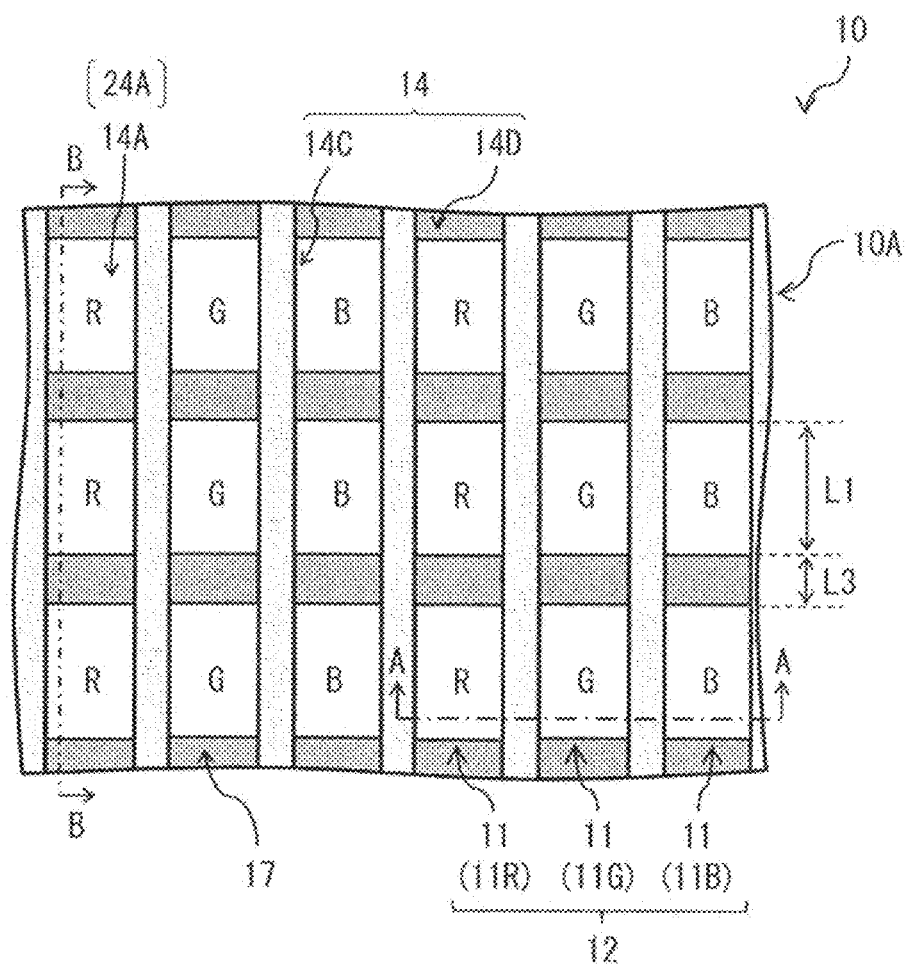
FIG. 3 is a diagram illustrating an example of a schematic configuration of a light-emitting panel illustrated in FIG. 1.
Figure 4:
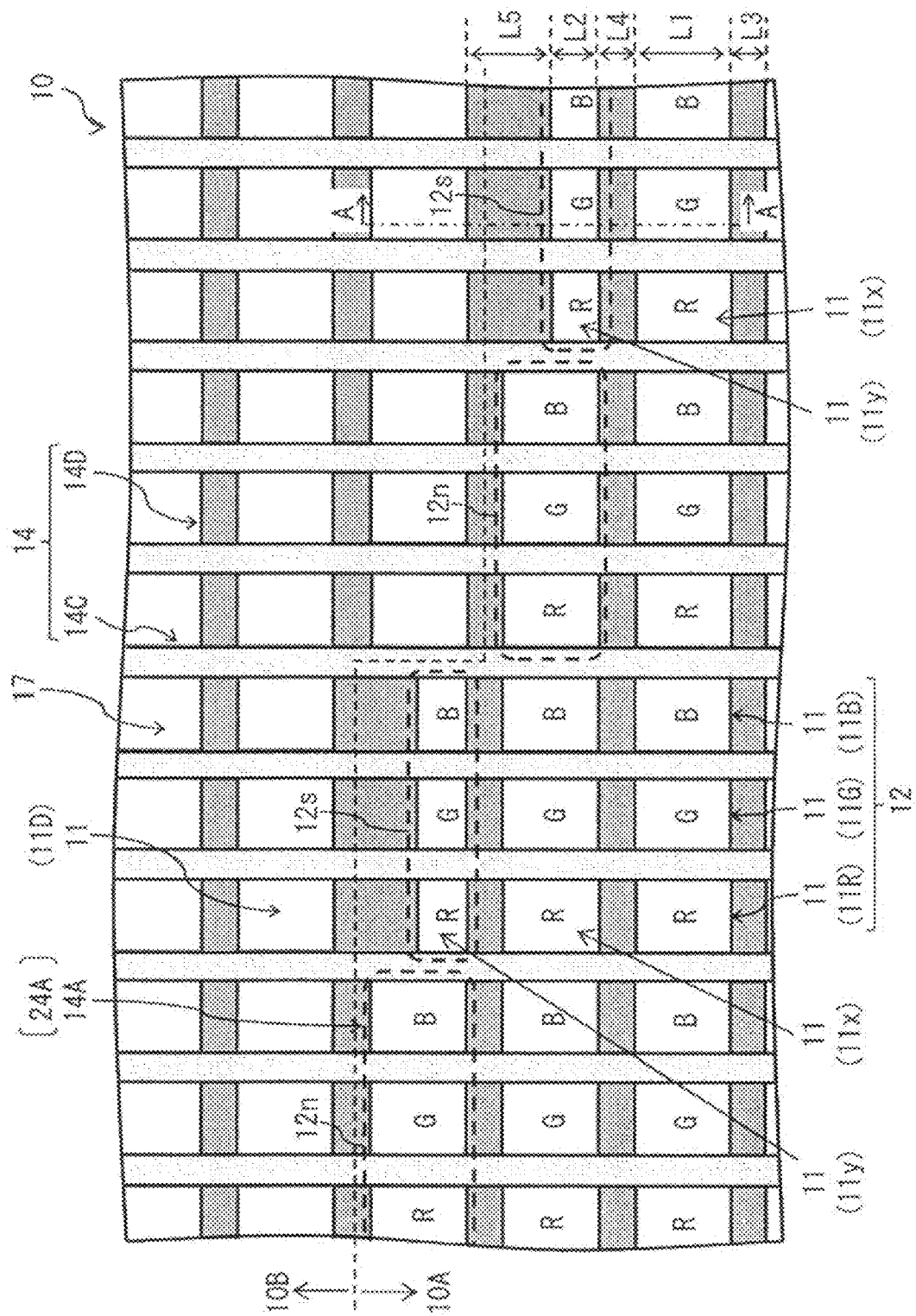
FIG. 4 is a diagram illustrating an example of a schematic configuration of the light-emitting panel in FIG. 1.
Figure 5:
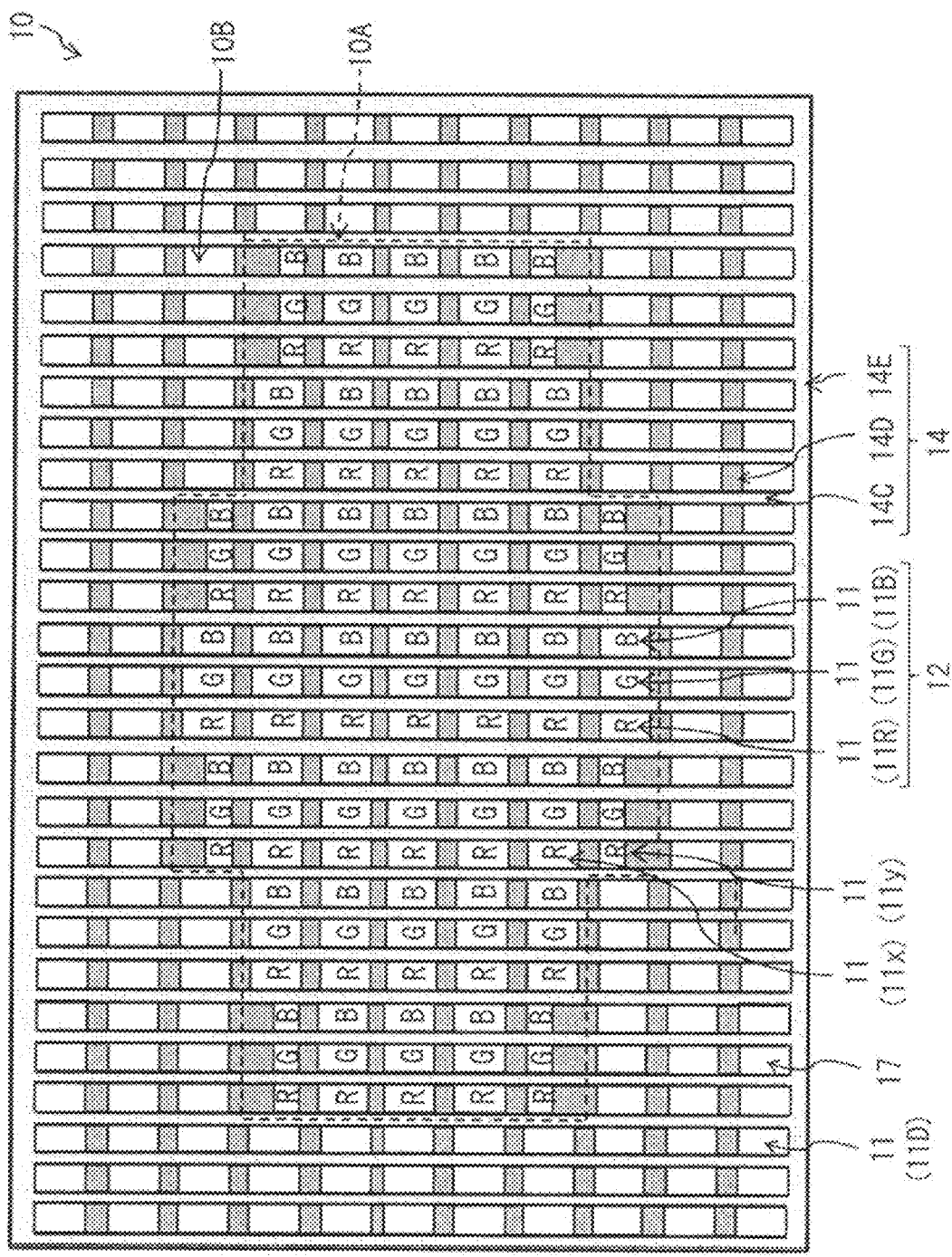
FIG. 5 is a diagram illustrating an example of a schematic configuration of the light-emitting panel in FIG. 1.
Figure 6:
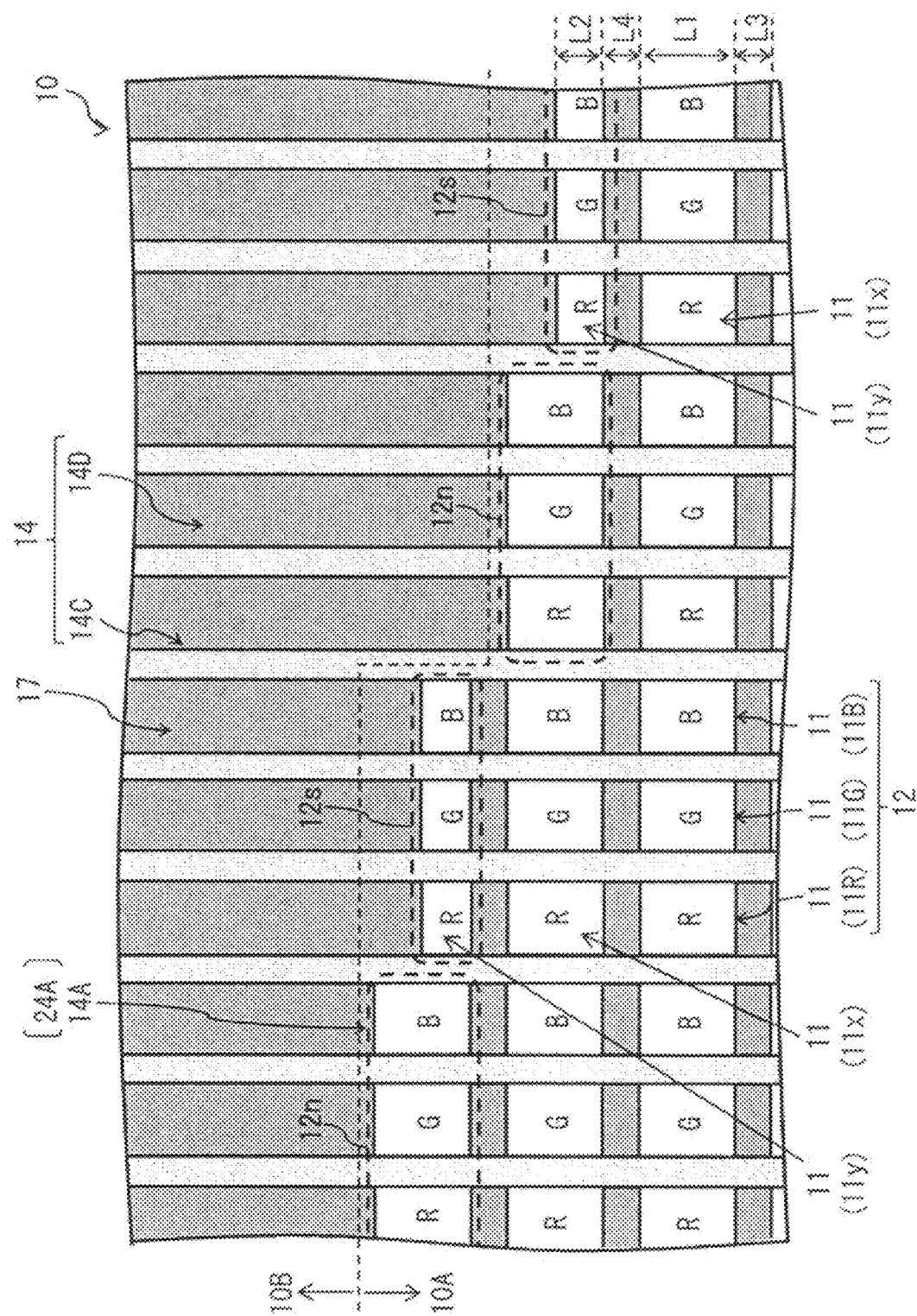
FIG. 6 is a diagram illustrating an example of a schematic configuration of the light-emitting panel in FIG. 1.
Figure 7:
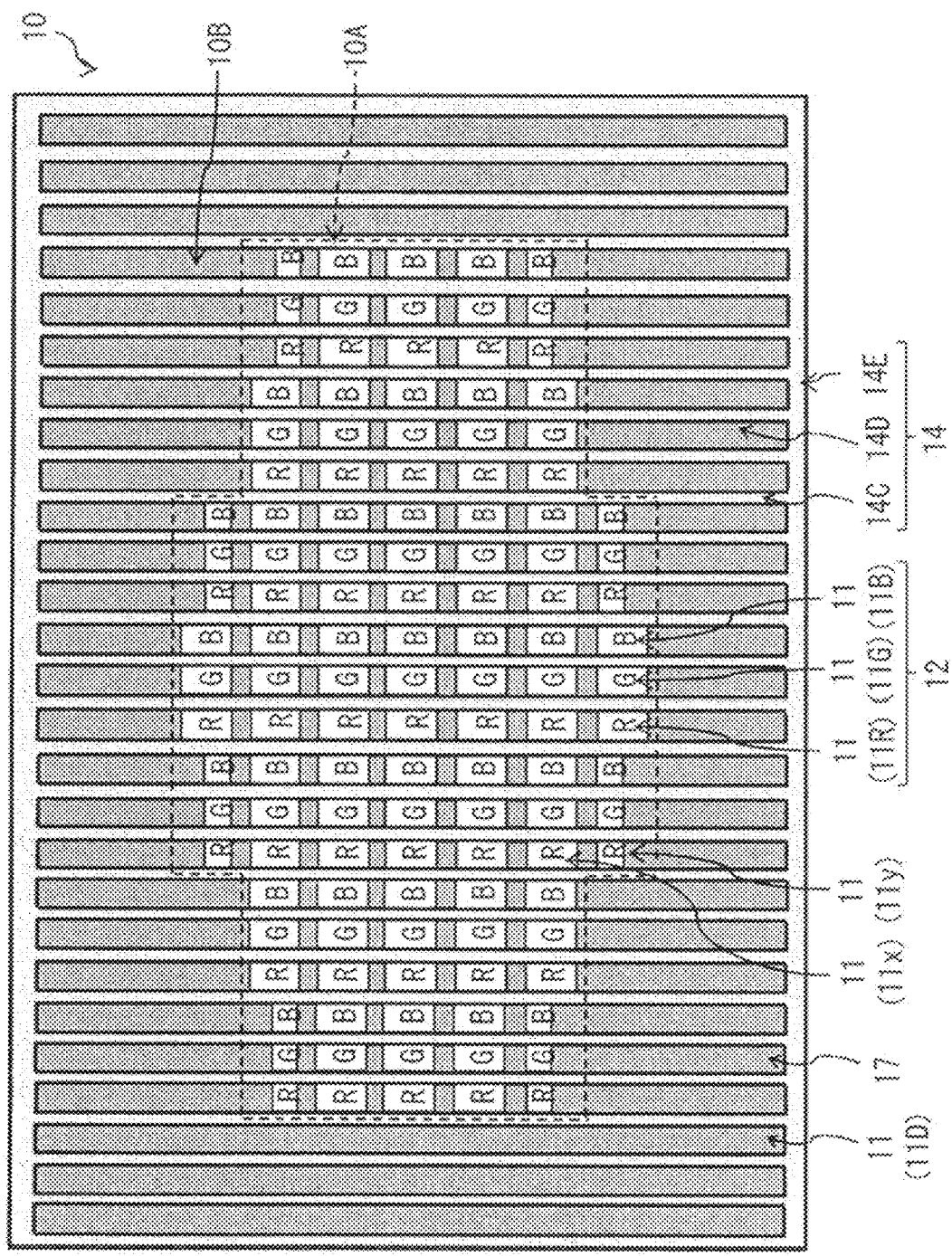
FIG. 7 is a diagram illustrating an example of a schematic configuration of the light-emitting panel in FIG. 1.

The light-emitting element 11-2 will now be described with reference to FIGS. 3 to 10. FIGS. 3 to 7 each illustrate an example of a schematic configuration of the light-emitting panel 10. FIG. 3 illustrates an example of a planar configuration in a display region 10A of the light-emitting panel 10. The display region 10A may be a region where an image is displayed in the light-emitting panel 10. The light-emitting panel 10 may include a non-display region 10B in addition to the display region 10A. The non-display region 10B may be provided around the display region 10A. The non-display region 10B may correspond to a bezel of the light-emitting panel 10. No image may be displayed in the non-display region 10B. FIG. 4 illustrates an example of a planar configuration of a boundary portion between the display region 10A and the non-display region 10B in the light-emitting panel 10. FIG. 5 illustrates an example of a planar configuration of the entire light-emitting panel 10. FIG. 6 illustrates one modification example of the planar configuration of the boundary portion between the display region 10A and the non-display region 10B in the light-emitting panel 10. FIG. 7 illustrates one modification example of the planar configuration of the entire light-emitting panel 10.

Figure 8:
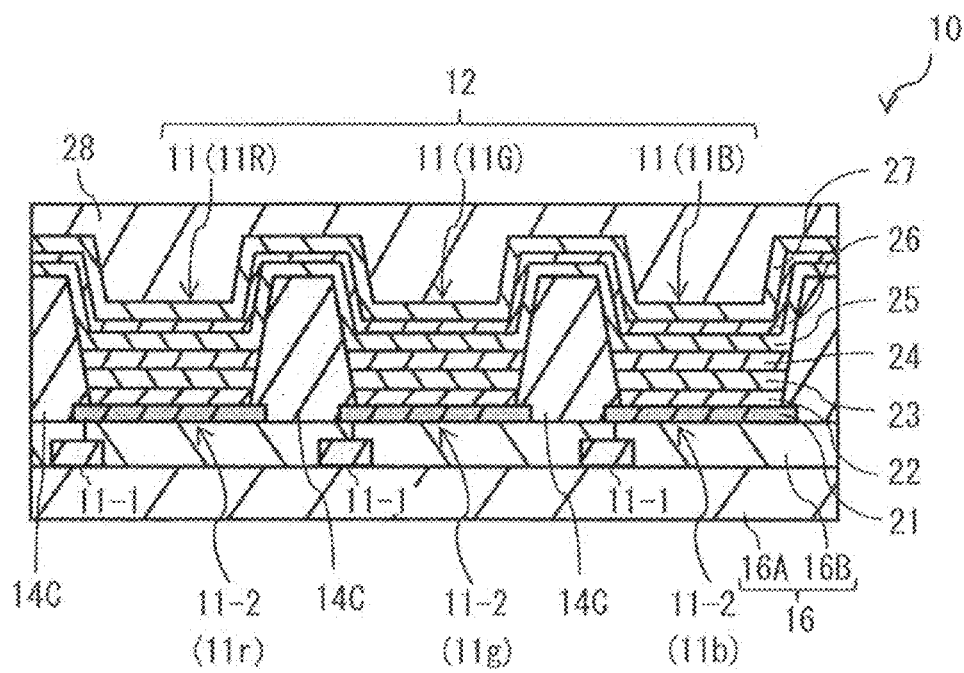
FIG. 8 is a diagram illustrating an example of a cross-sectional configuration of the light-emitting panel taken along the line A-A in FIG. 3.
Figure 9:
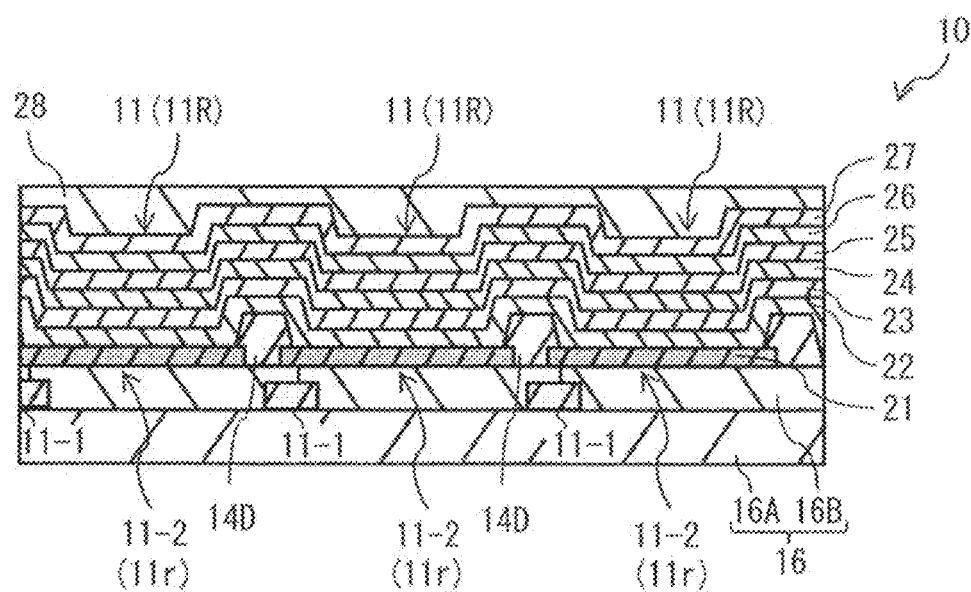
FIG. 9 is a diagram illustrating an example of a cross-sectional configuration of the light-emitting panel taken along the line B-B in FIG. 3.
Figure 10:
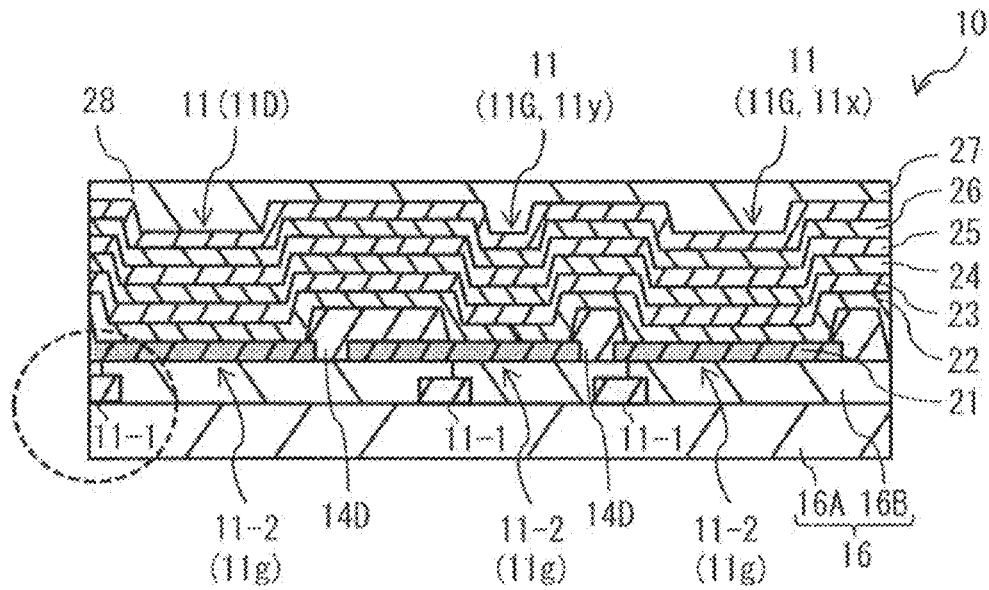
FIG. 10 is a diagram illustrating an example of a cross-sectional configuration of the light-emitting panel taken along the line A-A in FIG. 4.
Figure 11:
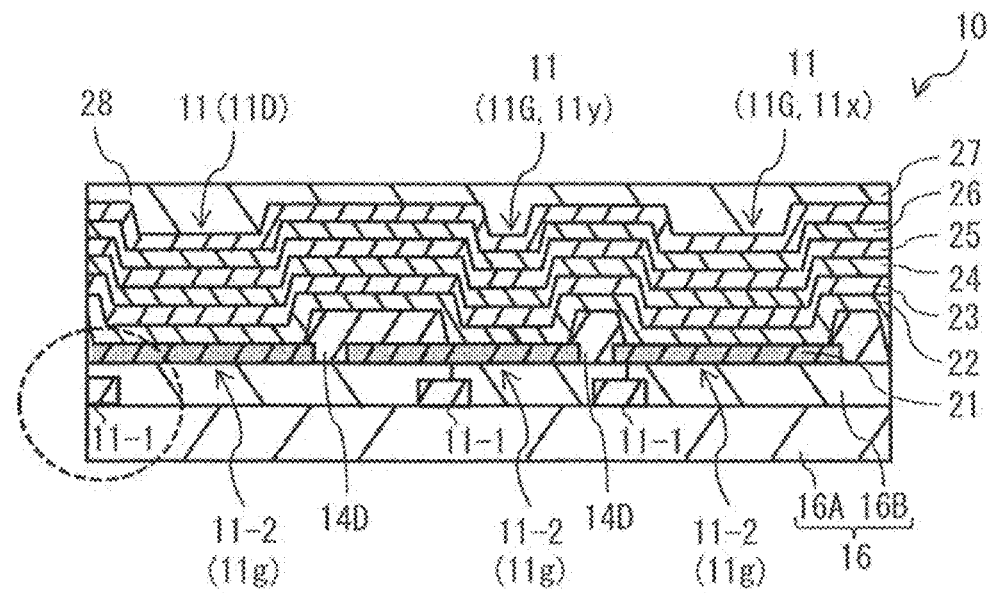
FIG. 11 is a diagram illustrating an example of a cross-sectional configuration of the light-emitting panel taken along the line A-A in FIG. 4.
Figure 12:
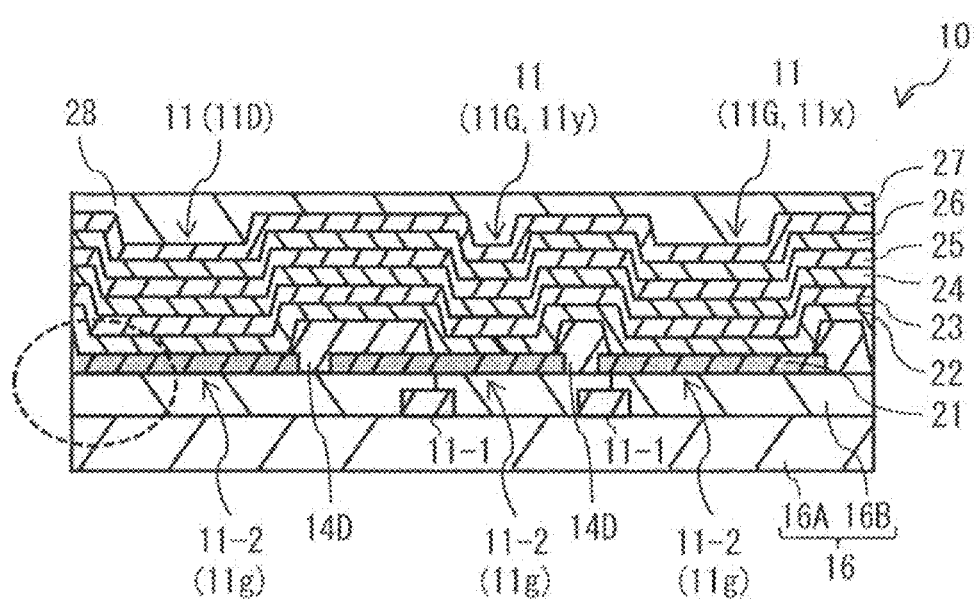
FIG. 12 is a diagram illustrating an example of a cross-sectional configuration of the light-emitting panel taken along the line A-A in FIG. 4.

FIG. 8 illustrates an example of a cross-sectional configuration of the light-emitting panel 10 taken along the line A-A in FIG. 3. FIG. 8 illustrates an example of a cross-sectional configuration of the pixels 11 in the row direction. FIG. 9 illustrates an example of a cross-sectional configuration of the light-emitting panel 10 taken along the line B-B in FIG. 3. FIG. 9 illustrates an example of a cross-sectional configuration of the pixels 11 in the column direction. FIGS. 10 to 12 each illustrate an example of a cross-sectional configuration of the light-emitting panel 10 taken along the line A-A in FIG. 4. FIGS. 10 to 12 each illustrate an example of a cross-sectional configuration near the boundary between the display region 10A and the non-display region 10B.

The light-emitting panel 10 includes the plurality of pixels 11. The pixels 11 may be arranged in matrix. As described above, the pixels 11 in the light-emitting panel 10 may include, for example, the pixel 11R, the pixel 11G, and the pixel 11B. The display pixels 12 may be allocated to respective groups of the pixels 11R, 11G, and 11B. Note that, as described above, each of the display pixels 12 may further include a pixel 11 that emits light of another color, such as white or yellow, for example. Each of the display pixels 12 may include pixels 11 of the same color, such as two pixels 11 that emit blue light, for example.

The pixel 11R may include the light-emitting element 11-2 (11r) emitting red light. The pixel 11G may include the light-emitting element 11-2 (11g) emitting green light. The pixel 11B may include the light-emitting element 11-2 (11b) emitting blue light. The pixels 11R, 11G, and 11B may be arranged in a stripe pattern. The pixels 11R, 11G, and 11B may be arranged along the row direction for each color, for example. The pixels 11 emitting light of the same color may be arranged along the column direction in each pixel column, for example.

The light-emitting panel 10 may include a substrate 16. The substrate 16 may include a base 16A and a wiring layer 16B provided on the base 16A. The base 16A may support, for example, the light-emitting elements 11-2 and an insulating layer 14. The base 16A may be, for example, a light-transmitting substrate that transmits light, such as a transparent substrate. The base 16A may include, for example, non-alkali glass, soda glass, nonfluorescent glass, phosphate glass, borate glass, or quartz. Alternatively, the base 16A may include, for example, acrylic resin, styrene resin, polycarbonate resin, epoxy resin, polyethylene, polyester, silicone resin, or alumina. In a case of forming the base 16A using a resin, the following process may be performed, for example, for easy formation: once forming the base 16A on a substrate such as a glass substrate, followed by, after preparation of the light-emitting panel 10, separating the base 16A from the glass substrate mechanically or by using laser. The wiring layer 16B may include, for example, the pixel circuits 11-1 of the respective pixels 11. The base 16A may additionally include a planarization film in which the pixel circuits 11-1 of the respective pixels 11 are buried. The substrate 16 may have a rectangular shape, for example, as illustrated in FIG. 5.

The light-emitting panel 10 may further include the insulating layer 14 on the substrate 16. The insulating layer 14 may define each of the pixels 11. In one example, an upper limit thickness of the insulating layer 14 may be within a range that allows for shape control of the insulating layer 14 during the manufacture of the insulating layer 14, in consideration of variations in film thickness and control of a bottom line width. In another example, the upper limit thickness of the insulating layer 14 may be within a range that suppresses an increase in tact time with an increase in exposure time in an exposing process and that suppresses a reduction in productivity on mass production lines. Additionally, a lower limit thickness of the insulating layer 14 may be determined on the basis of resolution limits of an exposure device and a material of the insulating layer 14, for example. One reason for this is that as the film thickness becomes thinner, the bottom line width is to be adjusted to substantially the same extent as the film thickness, in this example. In consideration of insulating properties, the insulating layer 14 may at least have a thickness enough to cover a level difference due to the anode 21.

The insulating layer 14 may include a plurality of column regulators 14C, a plurality of row regulators 14D, and a perimeter regulator 14E. The column regulators 14C, the row regulators 14D, and the perimeter regulator 14E may define each of the pixels 11. In FIGS. 3 to 7, black-colored places are the row regulators 14D. Moreover, out of gray-colored places, an outer edge portion of the light-emitting panel 10 is the perimeter regulator 14E, and places other than the perimeter regulator 14E are the column regulators 14C. The column regulator 14C may correspond to a specific but non-limiting example of a "first regulator" according to one embodiment of the disclosure. The row regulator 14D may correspond to a specific but non-limiting example of a "second regulator", a "third regulator", and a "fourth regulator" according to one embodiment of the disclosure.

Each of the column regulators 14C extends in a predetermined direction (first direction), and each of the row regulators 14D extends in a direction (second direction) orthogonal to the column regulators 14C. The column regulators 14C extending in the column direction (first direction) may be disposed side by side to each other at a predetermined interval along the row direction (second direction). The column regulator 14C defines two of the pixels 11 that are adjacent to each other in the row direction. The row regulators 14D extending in the row direction may be disposed side by side to each other at a predetermined interval along the column direction. The row regulator 14D defines two of the pixels 11 that are adjacent to each other in the column direction. The column regulators 14C may intersect the respective row regulators 14D to form a grid-pattern. For example, the column regulators 14C may be orthogonal to the respective row regulators 14D. The perimeter regulator 14E may be provided in an outer edge portion of the light-emitting panel 10, and may be shaped like a ring. In places other than the outer edge portion of the light-emitting panel 10, each of the pixels 11 may be surrounded by two of the column regulators 14C that are adjacent to each other and two of the row regulators 14D that are adjacent to each other. In the outer edge portion of the light-emitting panel 10, each of the pixels 11 may be surrounded by the column regulator 14C, the row regulator 14D, and the perimeter regulator 14E. Accordingly, each of the pixels 11 may be defined by at least the column regulator 14C and the row regulator 14D out of the column regulator 14C, the row regulator 14D, and the perimeter regulator 14E.

The insulating layer 14 may further include an opening 14A in a region surrounded by two of the column regulators 14C that are adjacent to each other and two of the row regulators 14D that are adjacent to each other in places other than the outer edge portion of the light-emitting panel 10. The insulating layer 14 may further include an opening 14A in a region surrounded by the column regulator 14C and the row regulator 14D, and the perimeter regulator 14E in the outer edge portion of the light-emitting panel 10. A surface of the anode 21 described below may be exposed at the bottom of each of the openings 14A. This allows holes supplied from the anode 21 exposed at the bottom of each of the openings 14A to be recombined with respective electrons supplied from the cathode 27 described below in a light-emitting layer 24 described below, causing the light-emitting layer 24 to emit light. Accordingly, the light-emitting layer 24 may have light-emitting regions 24A opposed to the respective openings 14A.

In one example illustrated in FIGS. 8 to 10, for example, the row regulator 14D has a height (from the substrate 16) smaller than a height (from the substrate 16) of the column regulator 14C. The height (from the substrate 16) of the row regulator 14D may be, for example, about half the height of the column regulator 14C. The height (from the substrate 16) of the row regulator 14D may be, for example, 0.1 µm to 2 µm, and may be 0.1 µm to 1 µm. The height (from the substrate 16) of the column regulator 14C may be, for example, 0.1 µm to 3 µm, and may be 0.3 µm to 1.5 µm. In the example embodiment of the disclosure, the height (from the substrate 16) of the column regulator 14C may be 1 µm in a case where the height (from the substrate 16) of the row regulator 14D is 0.5 µm. In this example, the pixels 11 aligned in the column direction may be disposed in a strip groove 17 (a gap). The strip groove 17 may be defined by two of the column regulators 14C that are disposed on opposite sides of the aligned pixels 11. Additionally, the aligned pixels 11 may share a layer including a coating film with each other. The layer may be, for example, a hole injection layer 22, a hole transport layer 23, and the light-emitting layer 24 described below. As illustrated in FIGS. 3 to 7, for example, the pixels 11 aligned in the column direction may be disposed along the column regulators 14C. The perimeter regulator 14E may have a height (from the substrate 16) larger than a height (from the substrate 16) of the row regulator 14D. For example, the perimeter regulator 14E may have a height (from the substrate 16) equal to a height (from the substrate 16) of the column regulator 14C. In a case where the row regulator 14D and the column regulator 14C have equal heights, the row regulator 14D and the column regulator 14C may be formed collectively as the same layer.

The groove 17 may be defined in a region that is surrounded by two of the column regulators 14C parallel to each other and adjacent to each other and the perimeter regulator 14E. Surfaces of the column regulators 14C and the perimeter regulator 14E may have a liquid-repellent property relatively as compared with surfaces of the row regulators 14D. In a case where a base layer is formed by film coating on the surfaces of the row regulators 14D and the surface of the anode 21, the surfaces of the column regulators 14C and the perimeter regulator 14E may have a liquid-repellent property relatively as compared with a surface of the base layer. In applying ink, a base layer refers to a layer applied immediately before application of the ink. For example, in a case of applying ink to form the hole injection layer 22, the base layer may refer to the anode 21. In a case of applying ink to form the hole transport layer 23, the base layer may refer to the hole injection layer 22. In a case of applying ink to form the light-emitting layer 24, the base layer may refer to the hole transport layer 23. Therefore, the column regulators 14C and the perimeter regulator 14E prevent ink from flowing into another adjacent groove 17 when, for example, the hole injection layer 22, the hole transport layer 23, and the light-emitting layer 24 are formed by a coating method. The liquid-repellent property of the column regulators 14C and the perimeter regulator 14E may be achieved by a liquid-repellent property of a resin itself, or by imparting a liquid-repellent property to a surface of the resin by, for example, fluorine plasma treatment. The row regulators 14D may have a lyophilic property relatively as compared with the column regulators 14C and the perimeter regulator 14E. Therefore, the row regulators 14D do not inhibit ink from spreading within the groove 17 when, for example, the hole injection layer 22, the hole transport layer 23, and the light-emitting layer 24 are formed by a coating method. The row regulators 14D may allow ink to spread on the surfaces of the row regulators 14D when, for example, the hole injection layer 22, the hole transport layer 23, and the light-emitting layer 24 are formed by a coating method. The column regulators 14C and the row regulators 14D may be formed through different processes, for example.

Each of the light-emitting elements 11-2 may include, in order, the substrate 16, the anode 21, the hole injection layer 22, the hole transport layer 23, the light-emitting layer 24, an electron transport layer 25, an electron injection layer 26, and the cathode 27, for example.

The light-emitting element 11-2 may include the anode 21, the light-emitting layer 24, and the cathode 27. The light-emitting layer 24 may be provided between the anode 21 and the cathode 27, for example. The light-emitting element 11-2 may further include, in order from the anode 21, the hole injection layer 22 and the hole transport layer 23 that are provided between the anode 21 and the light-emitting layer 24, for example. Note that one or both of the hole injection layer 22 and the hole transport layer 23 may be omitted. The light-emitting element 11-2 may further include, in order from the light-emitting layer 24, the electron transport layer 25 and the electron injection layer 26 that are provided between the light-emitting layer 24 and the cathode 27, for example. Note that one or both of the electron transport layer 25 and the electron injection layer 26 may be omitted. The light-emitting element 11-2 may have a device structure that includes the anode 21, the hole injection layer 22, the hole transport layer 23, the light-emitting layer 24, the electron transport layer 25, the electron injection layer 26, and the cathode 27 in this order from the substrate 16. The light-emitting element 11-2 may further include additional functional layers.

The hole injection layer 22 may enhance efficiency in injecting holes. The hole transport layer 23 may transport, to the light-emitting layer 24, holes injected from the anode 21. The light-emitting layer 24 may emit light of a predetermined color through recombination of electrons and holes. The electron transport layer 25 may transport, to the light-emitting layer 24, electrons injected from the cathode 27. The electron injection layer 26 may enhance efficiency in injecting electrons. One or both of the hole injection layer 22 and the electron injection layer 26 may be omitted. The light-emitting element 11-2 may further include other layers in addition to the layers described above.

The anode 21 may be provided on the substrate 16, for example. The anode 21 may be an electrode including aluminum (Al), silver (Ag), or an alloy thereof, for example, or may be a reflective electrode having reflectivity. The anode 21 is not limited to a reflective electrode, and may be a transparent electrode having a light-transmitting property, for example. Specific but non-limiting examples of a material of the transparent electrode may include a transparent electrically-conductive material, such as indium tin oxide (ITO) or indium zinc oxide (IZO). Alternatively, the anode 21 may be a laminate that includes a transparent electrode and a reflective electrode. An end portion of the anode 21 may be buried in the insulating layer 14, for example. In a case where an end portion of the anode 21 is buried in the insulating layer 14, changing a size of each of the openings 14A (in one example, a size of the bottom of each of the openings 14A) enables adjustment of a size (area) of the pixel 11 and a size (area) of the light-emitting region 24A.

The cathode 27 may be a transparent electrode such as an ITO film, for example. The cathode 27 is not limited to a transparent electrode, and may be a reflective electrode having reflectivity. Specific but non-limiting examples of a material of the reflective electrode may include aluminum (Al), magnesium (Mg), silver (Ag), an aluminum-lithium alloy, and a magnesium-silver alloy. In the example embodiment, in a case where the substrate 16 and the anode 21 have reflectivity and the cathode 27 has a light-transmitting property, the light-emitting element 11-2 may have a top-emission structure that emits light through the cathode 27. In the example embodiment, in a case where the substrate 16 and the anode 21 have a light-transmitting property and the cathode 27 has reflectivity, the light-emitting element 11-2 may have a bottom-emission structure that emits light through the substrate 16.

The hole injection layer 22 may include an organic material such as an electrically-conductive polymeric material. In one example, the hole injection layer 22 may be formed by applying an organic polymeric solution of an electrically-conductive polymeric material, such as a mixture of polythiophene and polystyrene sulfonate (PEDOT), to the anode 21, and drying the solution. In this case, the hole injection layer 22 may include a coating film. The hole injection layer 22 may include a material that is insoluble in a coating solution for the hole transport layer 23 or a material crosslinked by, for example, heat treatment in a case where the hole transport layer 23 is formed by coating.

The hole transport layer 23 may transport, to the light-emitting layer 24, holes injected from the anode 21. The hole transport layer 23 may be a coating film, for example. In one example, the hole transport layer 23 may be formed by applying and drying a solution that includes an organic material serving to transport, to the light-emitting layer 24, holes injected from the anode 21 (hereinafter referred to as "hole transporting material 23M"), as a main solute. The hole transport layer 23 may mainly, but not necessarily mainly include the hole transporting material 23M. The hole transport layer 23 may include a material that is insoluble in a coating solution for the light-emitting layer 24 or a material crosslinked by, for example, heat treatment in a case where the light-emitting layer 24 is formed by coating.

Specific but non-limiting examples of the hole transporting material 23M of the hole transport layer 23 may include an arylamine derivative, a triazole derivative, an oxadiazole derivative, an imidazole derivative, a polyarylalkane derivative, a pyrazoline derivative, a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, a tetraphenylbenzene derivative, or any combination thereof. A difference in highest occupied molecular orbital (HOMO) level between materials of the hole injection layer 22 and the hole transport layer 23 may be, for example, equal to or less than 0.5 eV in consideration of a hole injecting property.

In the light-emitting layer 24, a hole injected from the anode 21 and an electron injected from the cathode 27 may be recombined with each other to generate an exciton in the light-emitting layer 24. This may cause the light-emitting layer 24 to emit light. The light-emitting layer 24 may be a coating film, for example. In one example, the light-emitting layer 24 may be formed by applying and drying a solution that includes a solute that mainly, but not necessarily mainly includes an organic material generating excitons through the recombination of holes and electrons and thereby emitting light (hereinafter referred to as "organic luminescent material 24M"). The light-emitting layer 24 may mainly, but not necessarily mainly include the organic luminescent material 24M. The light-emitting element 11r in the pixel 11R may include the organic luminescent material 24M that includes a red organic luminescent material. The light-emitting element 11g in the pixel 11G may include the organic luminescent material 24M that includes a green organic luminescent material. The light-emitting element 11b in the pixel 11B may include the organic luminescent material 24M that includes a blue organic luminescent material.

The light-emitting layer 24 may have a monolithic organic light-emitting layer, or a laminate of a plurality of organic light-emitting layers, for example. In one example where the light-emitting layer 24 is a laminate of the organic light-emitting layers, the organic light-emitting layers may be coating films that include a common main component. The organic light-emitting layers may be formed by applying and drying a solution that includes the organic luminescent material 24M as a main solute.

In one example, the organic luminescent material 24M of the light-emitting layer 24 may include a single dopant material. In another example, the organic luminescent material 24M may include a host material and a dopant material in combination. In other words, the light-emitting layer 24 may include, as the organic luminescent material 24M, the host material and the dopant material. The host material may serve to transport electrical charges of electrons or holes, and the dopant material may serve to emit light. In still another example, the organic luminescent material 24M may include two or more host materials and two or more dopant materials in combination. For example, the amount of the dopant material may be within a range from 0.01 weight percent to 30 weight percent relative to the amount of the host material. Alternatively, the amount of the dopant material may be within a range from 0.01 weight percent to 10 weight percent relative to the amount of the host material.

Specific but non-limiting examples of the host material of the light-emitting layer 24 may include an amine compound, a condensed polycyclic aromatic compound, and a heterocyclic compound. Specific but non-limiting examples of the amine compound may include a monoamine derivative, a diamine derivative, a triamine derivative, and a tetraamine derivative. Specific but non-limiting examples of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Specific but non-limiting examples of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

Specific but non-limiting examples of the dopant material of the light-emitting layer 24 may include a pyrene derivative, a fluoranthene derivative, an arylacetylene derivative, a fluorene derivative, a perylene derivative, an oxadiazole derivative, an anthracene derivative, and a chrysene derivative. Alternatively, the dopant material of the light-emitting layer 24 may include a metal complex. The metal complex may include a ligand and a metal atom of iridium (Ir), platinum (Pt), osmium (Os), gold (Au), rhenium (Re), or ruthenium (Ru), for example.

The electron transport layer 25 may transport, to the light-emitting layer 24, electrons injected from the cathode 27. The electron transport layer 25 may mainly, but not necessarily mainly include an organic material having an electron transporting property (hereinafter referred to as "electron transporting material 25M"). The electron transport layer 25 may be a deposited film or a sputtered film. For example, the electron transport layer 25 may have a charge blocking property of suppressing or preventing tunneling of charges (e.g., holes in this example embodiment) from the light-emitting layer 24 to the cathode 27, and a property of suppressing or preventing light extinction of the light-emitting layer 24 in an excitation state.

The electron transporting material 25M of the electron transport layer 25 may include an aromatic heterocyclic compound containing one or more hetero atoms in a molecule, for example. The aromatic heterocyclic compound may contain, as a skeleton, a pyridine ring, a pyrimidine ring, a triazine ring, a benzimidazole ring, a phenanthroline ring, or a quinazoline ring, for example. Optionally, the electron transport layer 25 may contain a metal having an electron transporting property. The electron transport layer 25 that contains the metal having the electron transporting property exhibits an enhanced electron transporting property. Specific but non-limiting examples of the metal in the electron transport layer 25 may include barium (Ba), lithium (Li), calcium (Ca), potassium (K), cesium (Cs), sodium (Na), rubidium (Rb), and ytterbium (Yb).

The electron injection layer 26 may inject, in the electron transport layer 25 and the light-emitting layer 24, electrons injected from the cathode 27. The electron injection layer 26 may include, for example, an electron injecting material that facilitates the injection of electrons from the cathode 27 to the electron transport layer 25 and the light-emitting layer 24. The electron injecting material may include an organic material that has an electron injecting property and is doped with a metal having the electron injecting property, for example. The metal doped in the electron injection layer 26 may be the same as the metal in the electron transport layer 25, for example. The electron injection layer 26 may be, for example, a deposited film or a sputtered film.

In the example embodiment, the layers, such as the hole injection layer 22, the hole transport layer 23, the light-emitting layer 24, the electron transport layer 25, or the electron injection layer 26, in the light-emitting element 11-2 may be shared between the pixels 11 that share the groove 17. In other words, the layers, such as the hole injection layer 22, the hole transport layer 23, the light-emitting layer 24, the electron transport layer 25, or the electron injection layer 26, in the light-emitting element 11-2 may extend in the groove 17 along the column direction and beyond the row regulators 14D (in other words, over the row regulators 14D), as illustrated in FIGS. 9 to 12.

In the example embodiment, one or more of the layers, such as the hole injection layer 22, the hole transport layer 23, or the light-emitting layer 24, in the light-emitting element 11-2 may not be shared between the pixels 11 in each display pixel 12, and may be individually provided for each of the pixels 11 in each display pixel 12. In other words, one or more of the layers, such as the hole injection layer 22, the hole transport layer 23, or the light-emitting layer 24, in the light-emitting element 11-2 may be separated by the column regulators 14C, as illustrated in FIG. 8, for example. Moreover, in the example embodiment, one or more of the layers, such as the electron transport layer 25 or the electron injection layer 26, in the light-emitting element 11-2 may be shared between the pixels 11 in each display pixel 12. In other words, one or more of the layers, such as the electron transport layer 25 or the electron injection layer 26, in the light-emitting element 11-2 may extend beyond the column regulators 14C (in other words, over the column regulators 14C), as illustrated in FIG. 8, for example.

In the example embodiment, the cathode 27 may extend over the entire light-emitting panel 10 (e.g., the display region 10A and the non-display region 10B). For example, the cathode 27 may continuously extend over the entire surfaces of the electron injection layer 26, the column regulators 14C, and the row regulators 14D.

As illustrated in FIGS. 8 to 12, for example, the light-emitting element 11-2 may further include a layer (sealing layer 28) that protects and seals the light-emitting element 11-2. Specific but non-limiting examples of the sealing layer 28 may include an inorganic thin film, such as a SiNx film or a SiON film, formed by a method such as chemical vapor deposition (CVD), a laminated film including any of them, a resin material such as epoxy resin or vinyl resin, and a composite film including any of the inorganic films and the organic films.

The light-emitting panel 10 may include the plurality of pixels 11 in the non-display region 10B as well, as illustrated in FIGS. 4, 5, and 10 to 12, for example. The pixels 11 in the non-display region 10B may be dummy pixels 11D that do not emit light. In other words, the pixels 11 in the non-display region 10B may include the plurality of dummy pixels 11D as illustrated in FIGS. 4, 5, and 10 to 12. The dummy pixel 11D may correspond to a specific but non-limiting example of a "third pixel" according to one embodiment of the disclosure. For example, the dummy pixels 11D may be disposed along the boundary between the display region 10A and the non-display region 10B in the non-display region 10B, as illustrated in FIGS. 4 and 5. FIG. 5 illustrates an example of a state where the display region 10A is surrounded by the dummy pixels 11D. The dummy pixel 11D and the pixel 11 disposed at the boundary between the display region 10A and the non-display region 10B in the display region 10A (hereinafter referred to as the "pixel 11 near the boundary") may be, for example, adjacent to each other in the column direction with a specific defining region (the row regulator 14D), defining the dummy pixel 11D and the pixel 11 near the boundary, being interposed therebetween, as illustrated in FIGS. 4 and 5. The row regulator 14D provided between the dummy pixel 11D and the pixel 11 near the boundary may correspond to a specific but non-limiting example of a "third regulator" according to one embodiment of the disclosure. The row regulator 14D may be provided between the dummy pixel 11D and the pixel 11 near the boundary. The row regulator 14D provided between the dummy pixel 11D and the pixel 11 near the boundary may be provided across the boundary between the display region 10A and the non-display region 10B.

As illustrated in FIGS. 8 and 10 to 12, for example, the row regulator 14D defining the dummy pixel 11D and the pixel 11 near the boundary may have a height smaller than that of the column regulator 14C. In this example, the dummy pixel 11D and the pixel 11 near the boundary that are aligned in the column direction may be disposed in a gap (the strip groove 17) defined by two of the column regulators 14C disposed on opposite sides of the dummy pixel 11D and the pixel 11 near the boundary. The dummy pixel 11D and the pixel 11 near the boundary that are aligned in the column direction may share a layer including a coating film, such as the hole injection layer 22, the hole transport layer 23, or the light-emitting layer 24.

As illustrated in FIG. 4, for example, the row regulator 14D defining the dummy pixel 11D and the pixel 11 near the boundary may have a length L5 in a direction parallel to an extending direction of the column regulator 14C. The length L5 may be larger than lengths L3 and L4 (described below). The length L3 may be a length, in the direction parallel to the extending direction of the column regulator 14C, of the row regulator 14D defining two first pixels 11x (described below) aligned in the column direction. The row regulator 14D defining two first pixels 11x (described below) aligned in the column direction may correspond to a specific but non-limiting example of a "fourth regulator" according to one embodiment of the disclosure. The length L4 may be a length, in the direction parallel to the extending direction of the column regulator 14C, of the row regulator 14D defining the first pixel 11x and a second pixel 11y (described below) aligned in the column direction. The length L3 and the length L4 may be equal to each other, for example.

As illustrated in FIGS. 10 to 12, for example, each of the dummy pixels 11D may include the same element (light-emitting element 11-2) as the light-emitting element 11-2 included in each of the pixels 11 in the display region 10A. In one example, each of the dummy pixels 11D may also include a pixel circuit 11-1 electrically coupled to the anode 21 as illustrated in FIG. 10. In this example, the driver 30 may not drive the pixel circuit 11-1 in each of the dummy pixels 11D. In another example, each of the dummy pixels 11D may include a pixel circuit 11-1 electrically separated from the anode 21 as illustrated in FIG. 11. In still another example, the pixel circuit 11-1 itself may be omitted from each of the dummy pixels 11D as illustrated in FIG. 12. Alternatively, in the light-emitting panel 10, the row regulators 14D extending in the column direction may be provided as illustrated in FIGS. 6 and 7, for example, instead of providing the dummy pixels 11D in the non-display region 10B. In this example, the row regulators 14D extending in the column direction may be provided across the boundary between the display region 10A and the non-display region 10B.

Now, the pixels 11 in the display region 10A may at least include a plurality of pixels 11 (first pixels 11x and second pixels 11y) as illustrated in FIGS. 4 to 7 and 10 to 12, for example. In other words, the first pixels 11x and the second pixels 11y may be disposed in the display region 10A. The first pixel 11x may correspond to a specific but non-limiting example of a "first pixel" according to one embodiment of the disclosure. The second pixel 11y may correspond to a specific but non-limiting example of a "second pixel" according to one embodiment of the disclosure. The first pixel 11x and the second pixel 11y are adjacent to each other in the column direction. A defining region (row regulator 14D) is provided between the first pixel 11x and the second pixel 11y. The first pixel 11x and the second pixel 11y are adjacent to each other in the column direction (first direction) with the defining region (row regulator 14D) being interposed therebetween. The first pixel 11x and the second pixel 11y adjacent to each other in the column direction may share a layer including a coating film, such as the hole injection layer 22, the hole transport layer 23, or the light-emitting layer 24.

The row regulator 14D defining the first pixel 11x and the second pixel 11y may have a height smaller than that of the column regulator 14C as illustrated in FIGS. 8 to 12, for example. In this example, the first pixel 11x and the second pixel 11y aligned in the column direction may be disposed in a gap (the strip groove 17) defined by two of the column regulators 14C disposed on opposite sides of the first pixel 11x and the second pixel 11y. The first pixel 11x and the second pixel 11y aligned in the column direction may be disposed along two of the column regulators 14C disposed on opposite sides of the first pixel 11x and the second pixel 11y. Moreover, the row regulator 14D defining the first pixel 11x and the second pixel 11y may have a length L4 in the column direction that is equal to the length L3, as illustrated in FIGS. 4 and 6, for example.

The first pixel 11x and the second pixel 11y differ from each other in length in the column direction. The second pixel 11y may have a length L2 in the column direction that is smaller than the length L1 in the column direction of the first pixel 11x. In other words, the pixels 11 in the display region 10A may include pixels 11 (the first pixels 11x and the second pixels 11y) that differ from each other in length in the column direction.

The first pixel 11x and the second pixel 11y may be included in different display pixels 12. The first pixel 11x may be included in one of two display pixels 12 adjacent to each other in the column direction (first direction). The second pixel 11y may be included in another of two display pixels 12 adjacent to each other in the column direction (first direction). A plurality of display pixels 12 including a plurality of second pixels 11y (hereinafter referred to as "display pixels 12s") may be disposed at the boundary between the display region 10A and the non-display region 10B in the display region 10A. In other words, the second pixels 11y may be disposed at the boundary between the display region 10A and the non-display region 10B. A plurality of display pixels 12 including a plurality of first pixels 11x will hereinafter be referred to as "display pixels 12n". One or more of the display pixels 12n may each be disposed between two display pixels 12s at the boundary between the display region 10A and the non-display region 10B in the display region 10A. In other words, the display pixels 12n and the display pixels 12s may be disposed alternately along the boundary between the display region 10A and the non-display region 10B as illustrated in FIGS. 4 to 7, for example. Moreover, in the display region 10A, for example, one or more of the display pixels 12n may be adjacent, in the column direction, to the display pixels 12 disposed at the boundary between the display region 10A and the non-display region 10B. In a region of the display region 10A excluding the display pixels 12 provided at the outer edge, the display pixels 12n may be arranged in matrix, for example. This enables the boundary of an image generated by the display pixels 12s and 12n to be a curved line smoother than the boundary of an image generated in a case where the display pixels 12s are not used.

Each of the pixels 11 (the second pixels 11y) included in the display pixel 12s may have a pixel size (an area of the opening 14A) that is different from a pixel size (an area of the opening 14A) of each of the pixels 11 (the first pixels 11x) included in the display pixel 12n. In one example, the pixel size (the area of the opening 14A) of each of the pixels 11 (the second pixels 11y) included in the display pixel 12s may be smaller than the pixel size (the area of the opening 14A) of each of the pixels 11 (the first pixels 11x) included in the display pixel 12. In this example, each of the pixels 11 (the second pixels 11y) included in the display pixel 12s may have a pixel ratio (an area ratio of the opening 14A) that is equal to a pixel ratio (an area ratio of the opening 14A) of each of the pixels 11 (the first pixels 11x) included in the display pixel 12n. Luminance of the light-emitting element 11-2 may be controlled by electrical current density; hence, the display pixels 12s and 12n may have luminances equal to each other in a case where the display pixels 12s and 12n have pixel ratios equal to each other. The display pixels 12s and 12n also may have chromaticity ratios equal to each other in a case where the display pixels 12s and 12n have pixel ratios equal to each other. Note that each of the pixels 11 (the second pixels 11y) included in the display pixel 12s may have pixel sizes equal to each other or different from each other. Each of the pixels 11 (the first pixels 11x) included in the display pixel 12n may have pixel sizes equal to each other or different from each other.

[Manufacturing Method]

A method of manufacturing the light-emitting panel 10 according to the example embodiment of the disclosure will now be described.

Figure 13:
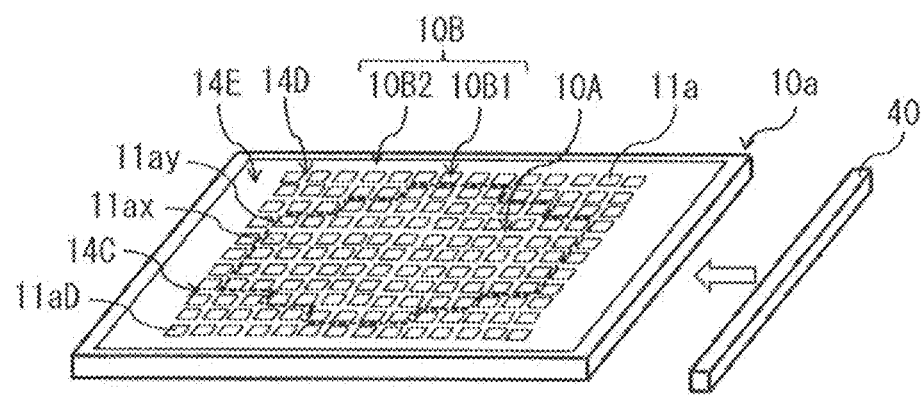
FIG. 13 is a diagram illustrating an example of a manufacturing process of the light-emitting panel in FIG. 1.

FIG. 13 illustrates an example of a manufacturing process of the light-emitting panel 10. FIG. 13 illustrates a panel 10a that may include the display region 10A, the non-display region 10B around the display region 10A, a plurality of pixel formation regions 11a, the column regulators 14C, the row regulators 14D, and the perimeter regulator 14E. The pixel formation regions 11a are provided in both the display region 10A and the non-display region 10B.

In the panel 10a, the pixel formation regions 11a may include a first pixel 11ax, which is the first pixel 11x being formed, a second pixel 11ay, which is the second pixel 11y being formed, and a third pixel 11aD, which is the dummy pixel 11D being formed. The first pixel 11ax and the second pixel 11ay are adjacent to each other in the column direction with the column regulator 14C being interposed therebetween. In the first pixel 11ax, the second pixel 11ay, and the third pixel 11aD, the hole transport layer 23, for example, may be provided at the bottom.

Figure 14:
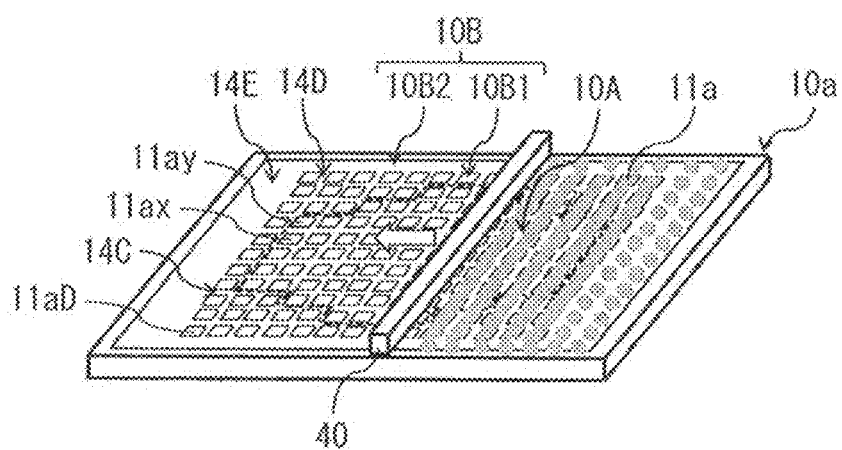
FIG. 14 is a diagram illustrating an example of a process following the process in FIG. 13.

First, the panel 10a illustrated in FIG. 13 and a coating head 40 may be prepared. The coating head 40 may be, for example, a discharging unit including a plurality of discharge heads aligned in line. The coating head 40 may periodically apply (discharge) ink for one line. It is to be noted that the coating head 40 may be a discharging unit including a plurality of discharge heads that is aligned in two or more lines within a width corresponding to one line of pixels. In this case, it is possible to adjust a discharge amount more finely than in a case where a plurality of discharge heads is aligned in line. Thereafter, for example, the coating head 40 may periodically apply (discharge) ink for one line while performing scanning in the row direction, as illustrated in FIG. 14.

In this example, ink is applied (discharged) to the non-display region 10B as well as the display region 10A of the panel 10a. This enables a coating film to be formed in the pixel formation regions 11a included in the non-display region 10B as well as the pixel formation regions 11a included in the display region 10A. For example, the coating film may be formed in a region 10B2 of the non-display region 10B in which no pixel formation region 11a is formed yet, the pixel formation regions 11a (i.e., a region 10B1 in which the pixel formation regions 11a are formed) in the non-display region 10B, and the pixel formation regions 11a in the display region 10A. Here, application (discharge) of ink may be started from the region 10B2 of the non-display region 10B in which no pixel formation region 11a is formed yet. Thereafter, ink may be applied (discharged), in the following order, to the pixel formation regions 11a (i.e., the region 10B1 in which the pixel formation regions 11a are formed) in the non-display region 10B, the pixel formation regions 11a in the display region 10A, the pixel formation regions 11a (i.e., the region 10B1 in which the pixel formation regions 11a are formed) in the non-display region 10B, and the region 10B2 of the non-display region 10B in which no pixel formation region 11a is formed yet. In this example, ink may be applied (discharged) also to the pixel formation regions 11a (i.e., the region 10B1 in which the pixel formation regions 11a are formed) in the non-display region 10B that are located on both sides in a direction orthogonal to a scanning direction of the coating head 40. Furthermore, ink may be applied (discharged) also to the perimeter regulator 14E that is located on both sides in the direction orthogonal to the scanning direction of the coating head 40.

In this manner, a pixel including a coating film may be formed in the pixel formation regions 11a included in the non-display region 10B as well as the pixel formation regions 11a included in the display region 10A.

Two of the pixel formation regions 11a adjacent to each other in the column direction may share a coating film. The coating film may undergo a predetermined drying process, for example, to become the light-emitting layer 24. The light-emitting layer 24 may have a thickness controlled by the number of droplets of ink discharged. Nanometer-order thickness control is desired for the light-emitting layer 24. Therefore, it originally has been substantially difficult to control coating films of different pixel sizes to the same thickness by controlling the number of droplets. However, even if pixels sizes are different, applying the example embodiment enables a coating solution to be shared after application. This extremely facilitates formation and control to obtain the same thickness. In addition, even finer thickness control is enabled by reducing droplet size and coating one line using a larger number of coating nozzles. It is also possible to form the hole injection layer 22 and the hole transport layer 23 below the light-emitting layer 24 by using a similar method.

On the surface of the perimeter regulator 14E, ink applied from the coating head 40 may remain in a droplet state at both ends in a direction parallel to the scanning direction of the coating head 40. One reason for this is that the perimeter regulator 14E may have a liquid-repellent property with respect to ink applied from the coating head 40. It is to be noted that in a case where ink is applied (discharged) also to the perimeter regulator 14E that is located on both sides in the direction orthogonal to the scanning direction of the coating head 40, ink applied from the coating head 40 may remain in a droplet state also at both ends in the direction orthogonal to the scanning direction of the coating head 40, on the surface of the perimeter regulator 14E. Thus, the ink may be dried by subsequent predetermined drying, without spreading into the pixel 11.

Thus, ink may be applied (discharged) to a surface of the non-display region 10B as well. This, for example, enables vapor pressure of ink in the display region 10A to be more uniform than in a case where ink is applied (discharged) only to the display region 10A. Uniform vapor pressure of ink in the display region 10A results in uniform drying conditions for a coating film formed in the pixel formation regions 11a of the display region 10A. Consequently, it is possible for a layer such as the light-emitting layer 24 formed in the pixel formation regions 11a of the display region 10A to have a uniform thickness. In addition, there is a case where ink discharge amount is unstable when the coating head 40 starts coating. This may be caused by thermal instability when the coating head 40 starts coating. Even in such a case, by applying (discharging) ink to the surface of the non-display region 10B before applying (discharging) ink to the display region 10A, it is possible to apply (discharge) ink to the display region 10A in a state where ink discharge by the coating head 40 is stabilized. The perimeter regulator 14E may have a liquid-repellent property, which enables ink to remain in a droplet state without spreading in the region 10B2 in which no pixel formation region 11a is formed yet. This makes it possible for a layer such as the light-emitting layer 24 formed in the pixel formation regions 11a of the display region 10A to have a uniform thickness.

Figure 15:
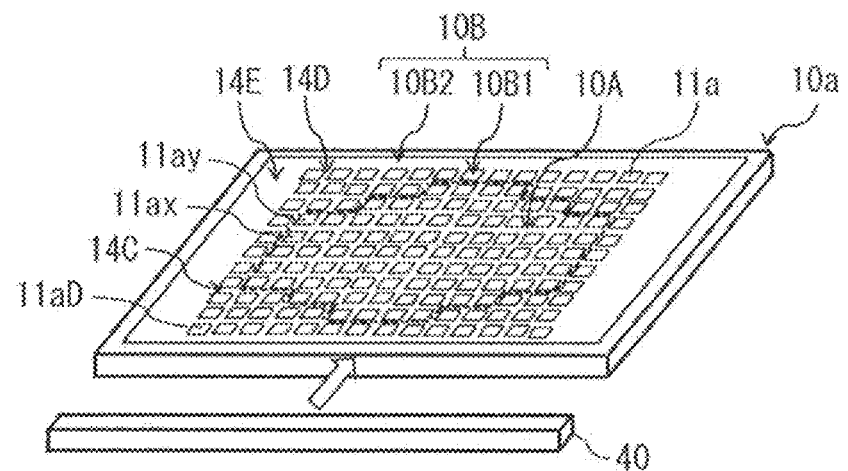
FIG. 15 is a diagram illustrating an example of a manufacturing process of the light-emitting panel in FIG. 1.

FIG. 15 illustrates another example of a manufacturing process of the light-emitting panel 10. FIG. 15 illustrates the panel 10a that may include the display region 10A, the non-display region 10B around the display region 10A, the plurality of pixel formation regions 11a, the column regulators 14C, the row regulators 14D, and the perimeter regulator 14E. The pixel formation regions 11a are provided in both the display region 10A and the non-display region 10B.

In the panel 10a, the pixel formation regions 11a may include the first pixel 11ax, which is the first pixel 11x being formed, the second pixel 11ay, which is the second pixel 11y being formed, and the third pixel 11aD, which is the dummy pixel 11D being formed. The first pixel 11ax and the second pixel 11ay are adjacent to each other in the column direction with the column regulator 14C being interposed therebetween. In the first pixel 11ax, the second pixel 11ay, and the third pixel 11aD, the hole transport layer 23, for example, may be provided at the bottom.

Figure 16:
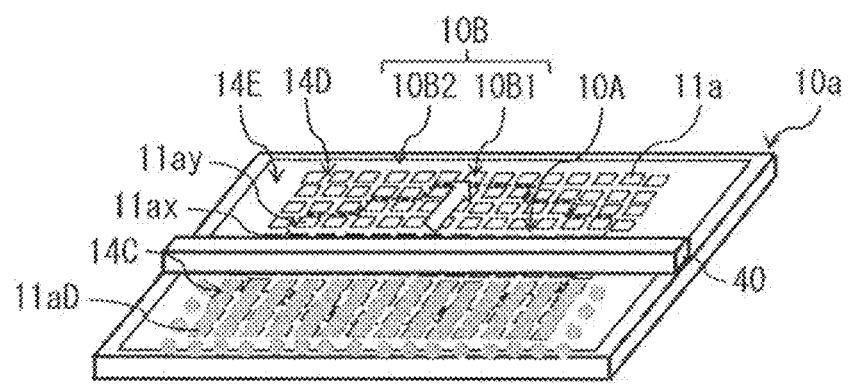
FIG. 16 is a diagram illustrating an example of a process following the process in FIG. 15.

First, the panel 10a illustrated in FIG. 15 and the coating head 40 may be prepared. The coating head 40 may be, for example, a discharging unit including a plurality of discharge heads aligned in line. The coating head 40 may periodically apply (discharge) ink for one line. Thereafter, for example, the coating head 40 may periodically apply (discharge) ink for one line while performing scanning in the column direction, as illustrated in FIGS. 15 and 16.

In this example, ink is applied (discharged) to the non-display region 10B as well as the display region 10A of the panel 10a. This enables a coating film to be formed in the pixel formation regions 11a included in the non-display region 10B as well as the pixel formation regions 11a included in the display region 10A. For example, the coating film may be formed in the region 10B2 of the non-display region 10B in which no pixel formation region 11a is formed yet, the pixel formation regions 11a (i.e., the region 10B1 in which the pixel formation regions 11a are formed) in the non-display region 10B, and the pixel formation regions 11a in the display region 10A. Here, application (discharge) of ink may be started from the region 10B2 of the non-display region 10B in which no pixel formation region 11a is formed yet. Thereafter, ink may be applied (discharged), in the following order, to the pixel formation regions 11a (i.e., the region 10B1 in which the pixel formation regions 11a are formed) in the non-display region 10B, the pixel formation regions 11a in the display region 10A, the pixel formation regions 11a (i.e., the region 10B1 in which the pixel formation regions 11a are formed) in the non-display region 10B, and the region 10B2 of the non-display region 10B in which no pixel formation region 11a is formed yet. In this example, ink may be applied (discharged) also to the pixel formation regions 11a (i.e., the region 10B1 in which the pixel formation regions 11a are formed) in the non-display region 10B that are located on both sides in a direction orthogonal to a scanning direction of the coating head 40. Furthermore, ink may be applied (discharged) also to the perimeter regulator 14E that is located on both sides in the direction orthogonal to the scanning direction of the coating head 40.

In this manner, a pixel including a coating film may be formed in the pixel formation regions 11a included in the non-display region 10B as well as the pixel formation regions 11a included in the display region 10A.

Two of the pixel formation regions 11a adjacent to each other in the column direction may share a coating film. The coating film may undergo a predetermined drying process, for example, to become the light-emitting layer 24.

On the surface of the perimeter regulator 14E, ink applied from the coating head 40 may remain in a droplet state at both ends in a direction parallel to the scanning direction of the coating head 40. One reason for this is that the perimeter regulator 14E may have a liquid-repellent property with respect to ink applied from the coating head 40. It is to be noted that in a case where ink is applied (discharged) also to the perimeter regulator 14E that is located on both sides in the direction orthogonal to the scanning direction of the coating head 40, ink applied from the coating head 40 may remain in a droplet state also at both ends in the direction orthogonal to the scanning direction of the coating head 40, on the surface of the perimeter regulator 14E. Thus, the ink may be dried by subsequent predetermined drying, without spreading into the pixel 11.

Thus, ink may be applied (discharged) to a surface of the non-display region 10B as well. This, for example, enables vapor pressure of ink in the display region 10A to be more uniform than in a case where ink is applied (discharged) only to the display region 10A. Uniform vapor pressure of ink in the display region 10A results in uniform drying conditions for a coating film formed in the pixel formation regions 11a of the display region 10A. Consequently, it is possible for a layer such as the light-emitting layer 24 formed in the pixel formation regions 11a of the display region 10A to have a uniform thickness. In addition, there is a case where ink discharge amount is unstable when the coating head 40 starts coating. This may be caused by thermal instability when the coating head 40 starts coating. Even in such a case, by applying (discharging) ink to the surface of the non-display region 10B before applying (discharging) ink to the display region 10A, it is possible to apply (discharge) ink to the display region 10A in a state where ink discharge by the coating head 40 is stabilized. The perimeter regulator 14E may have a liquid-repellent property, which enables ink to remain in a droplet state without spreading in the region 10B2 in which no pixel formation region 11a is formed yet. This makes it possible for a layer such as the light-emitting layer 24 formed in the pixel formation regions 11a of the display region 10A to have a uniform thickness. Adopting a coating method in which the coating head 40 performs scanning in the column direction as illustrated in FIG. 15 enables applied ink to be connected in the column direction, which is advantageous in that intervals between the discharge heads of the coating head 40 are not directly influenced by intervals between the pixels 11.

Example Effects

Described below are some example effects of the light-emitting panel 10 according to the example embodiment of the disclosure and the light-emitting unit 1 that includes the light-emitting panel 10.

In the example embodiment, provided are the first pixel 11x and the second pixel 11y that differ from each other in length in the column direction and share the light-emitting layer 24. The defining region (row regulator 14D) defining the first pixel 11x and the second pixel 11y may have a height smaller than a height of the column regulator 14C defining two of the pixels 11 that are adjacent to each other in the row direction. Thus, for example, when the light-emitting layer 24 of the first pixel 11x and the second pixel 11y is formed by a coating method, ink containing the material of the light-emitting layer 24 communicates between the first pixel 11x and the second pixel 11y via the defining region (row regulator 14D). This enables the light-emitting layer 24 to have a uniform thickness regardless of sizes of the first pixel 11x and the second pixel 11y. Consequently, it is possible to reduce display unevenness such as luminance unevenness. Furthermore, for example, when the hole injection layer 22 and the hole transport layer 23 of the first pixel 11x and the second pixel 11y are also formed by a coating method, ink containing the materials of the hole injection layer 22 and the hole transport layer 23 communicates between the first pixel 11x and the second pixel 11y via the defining region (row regulator 14D). This enables the hole injection layer 22 and the hole transport layer 23 to have uniform thicknesses regardless of sizes of the first pixel 11x and the second pixel 11y. Consequently, it is possible to further reduce display unevenness such as luminance unevenness.

In the example embodiment, the pixels 11 may be grouped into the display pixels 12 each including predetermined number of pixels 11. The first pixel 11x may be included in one of two display pixels 12 adjacent to each other in the column direction, and the second pixel 11y may be included in another of two display pixels 12 adjacent to each other in the column direction. Furthermore, the first pixel 11x and the second pixel 11y are adjacent to each other in the column direction. Thus, for example, when the light-emitting layer 24 of the first pixel 11x and the second pixel 11y is formed by a coating method, ink containing the material of the light-emitting layer 24 communicates between the first pixel 11x and the second pixel 11y via the defining region (row regulator 14D). Accordingly, the light-emitting layer 24 is able to have a uniform thickness as compared with a case where the first pixel 11x and the second pixel 11y are completely separated in coating. In other words, this enables the light-emitting layer 24 to have a uniform thickness regardless of sizes of the first pixel 11x and the second pixel 11y. Consequently, it is possible to reduce display unevenness such as luminance unevenness.

In the example embodiment, the first pixel 11x and the second pixel 11y may be disposed in a gap (the strip groove 17) between two of the column regulators 14C adjacent to each other. In this example, the first pixel 11x and the second pixel 11y may be disposed along the column regulators 14C. Thus, for example, when the light-emitting layer 24 of the first pixel 11x and the second pixel 11y is formed by a coating method, ink containing the material of the light-emitting layer 24 communicates between the first pixel 11x and the second pixel 11y via the defining region (row regulator 14D). Accordingly, the light-emitting layer 24 is able to have a uniform thickness as compared with a case where the first pixel 11x and the second pixel 11y are completely separated in coating. In other words, this enables the light-emitting layer 24 to have a uniform thickness regardless of sizes of the first pixel 11x and the second pixel 11y. Consequently, it is possible to reduce display unevenness such as luminance unevenness.

In the example embodiment, the second pixel 11y may have a length L2 that is smaller than the length L1 of the first pixel 11x, and the second pixel 11y may be disposed at the boundary between the display region 10A and the non-display region 10B. This enables the boundary of an image generated by the display pixels 12s and 12n to be a curved line smoother than the boundary of an image generated in a case where the display pixels 12s are not used.

In the example embodiment, the pixels 11 may include a plurality of dummy pixels 11D (third pixels) disposed in the non-display region 10B. In this case, the second pixel 11y and the dummy pixel 11D may be adjacent to each other in the column direction with a specific defining region (row regulator 14D), defining the second pixel 11y and the dummy pixel 11D, being interposed therebetween. In this example, the specific defining region (row regulator 14D) may have a length L5 in the column direction that is larger than the length L4 of the defining region (row regulator 14D) defining the first pixel 11x and the second pixel 11y. This makes it possible to adjust a profile of the boundary between the display region 10A and the non-display region 10B by only changing the length L5 of the specific defining region (row regulator 14D) defining the second pixel 11y and the dummy pixel 11D. Accordingly, the boundary between the display region 10A and the non-display region 10B is able to be a smoother curved line as compared with a case where the second pixel 11y is not used. Moreover, in a case of forming the dummy pixels 11D in the non-display region 10B in the example embodiment, ink may be applied (discharged) to the non-display region 10B before or after ink is applied (discharged) to the display region 10A in a manufacturing process. This makes it possible to suppress or prevent drying unevenness of the ink applied (discharged) to the display region 10A, thereby enabling the light-emitting layer 24 to have a uniform thickness. Consequently, it is possible to reduce display unevenness such as luminance unevenness.

2. MODIFICATION EXAMPLE

Some modification examples of the light-emitting panel 10 according to the foregoing example embodiment will now be described.

Modification Example A

Figure 17:
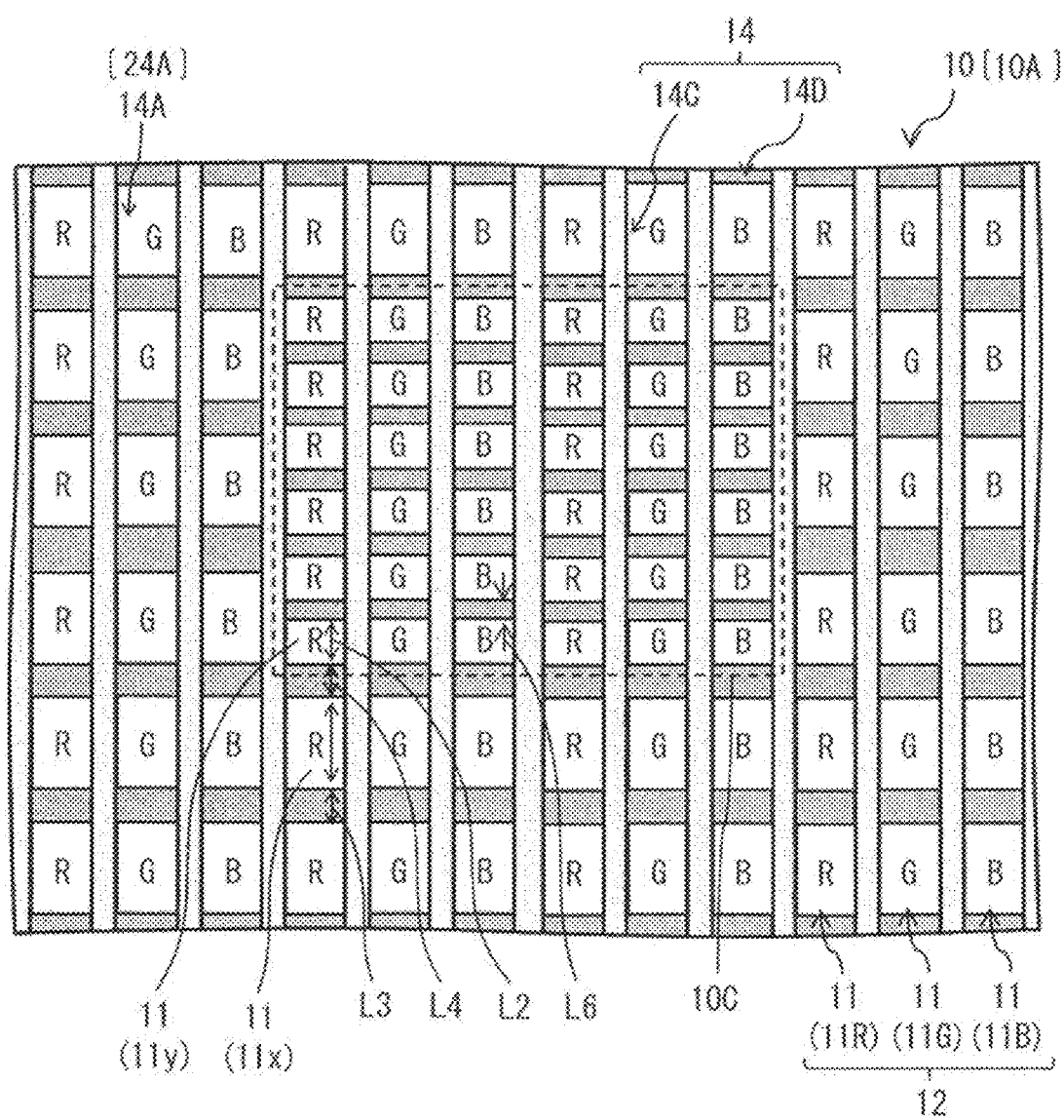
FIG. 17 is a diagram illustrating one modification example of a schematic configuration of the light-emitting panel in FIG. 1.

FIG. 17 illustrates one modification example of a schematic configuration of the light-emitting panel 10 according to the foregoing example embodiment. In the display region 10A of the light-emitting panel 10 according to the foregoing example embodiment, the pixels 11 may include the first pixels 11x arranged along the column direction and the second pixels 11y arranged along the column direction. In this case, a region (row regulator 14D) defining two of the second pixels 11y adjacent to each other in the column direction may have a length L6 in the column direction that is smaller than a length L3 in the column direction of a region (row regulator 14D) defining two of the first pixels 11x adjacent to each other in the column direction. The length L6 may be equal to a length L4 of the row regulator 14D (defining region) defining the first pixel 11x and the second pixel 11y. In such a case, a region including the second pixels 11y may serve as a region (high-definition region 10C) having a higher definition than other regions in the light-emitting panel 10.

The high-definition region 10C may thus be provided in the display region 10A in Modification Example A. Therefore, pixel rows in the high-definition region 10C may not match pixel rows in a region of the display region 10A excluding the high-definition region 10C. Hence, in Modification Example A, a plurality of scanning lines WSL may be disposed at a pitch corresponding to the pixel rows in the high-definition region 10C. Furthermore, one scanning line WSL may be allocated to each pixel row in the high-definition region 10C, and one or more scanning lines WSL may be allocated to each pixel row in a region of the display region 10A excluding the high-definition region 10C. Accordingly, in Modification Example A, the write scanner 32 may drive the pixels 11 in the high-definition region 10C via the scanning lines WSL, each of which is allocated to the corresponding pixel row. The write scanner 32 may drive the pixels 11 in a region of the display region 10A excluding the high-definition region 10C via the scanning lines WSL, each one or more of which are allocated to the corresponding pixel row.

In Modification Example A, the row regulator 14D defining the first pixel 11x and the second pixel 11y may have a height smaller than that of the column regulator 14C, as in the foregoing example embodiment. Furthermore, the row regulator 14D defining two of the second pixels 11y adjacent to each other may have a height smaller than that of the column regulator 14C. Thus, when the light-emitting layer 24 is formed by a coating method for the first pixel 11x and the second pixel 11y, for example, ink containing the material of the light-emitting layer 24 communicates across the first pixel 11x and the second pixel 11y via the row regulator 14D. This enables the light-emitting layer 24 to have a uniform thickness as compared with a case where the first pixel 11x and the second pixel 11y are completely separated in coating. In other words, the light-emitting layer 24 is able to have a uniform thickness regardless of sizes of the first pixel 11x and the second pixel 11y. Consequently, it is possible to reduce display unevenness such as luminance unevenness.

In Modification Example A, the pixel circuit 11-1 provided in each of the pixels 11 in the high-definition region 10C may have a size equal to or different from that of the pixel circuit 11-1 provided in each of the pixels 11 in a region of the display region 10A excluding the high-definition region 10C.

Figure 18:
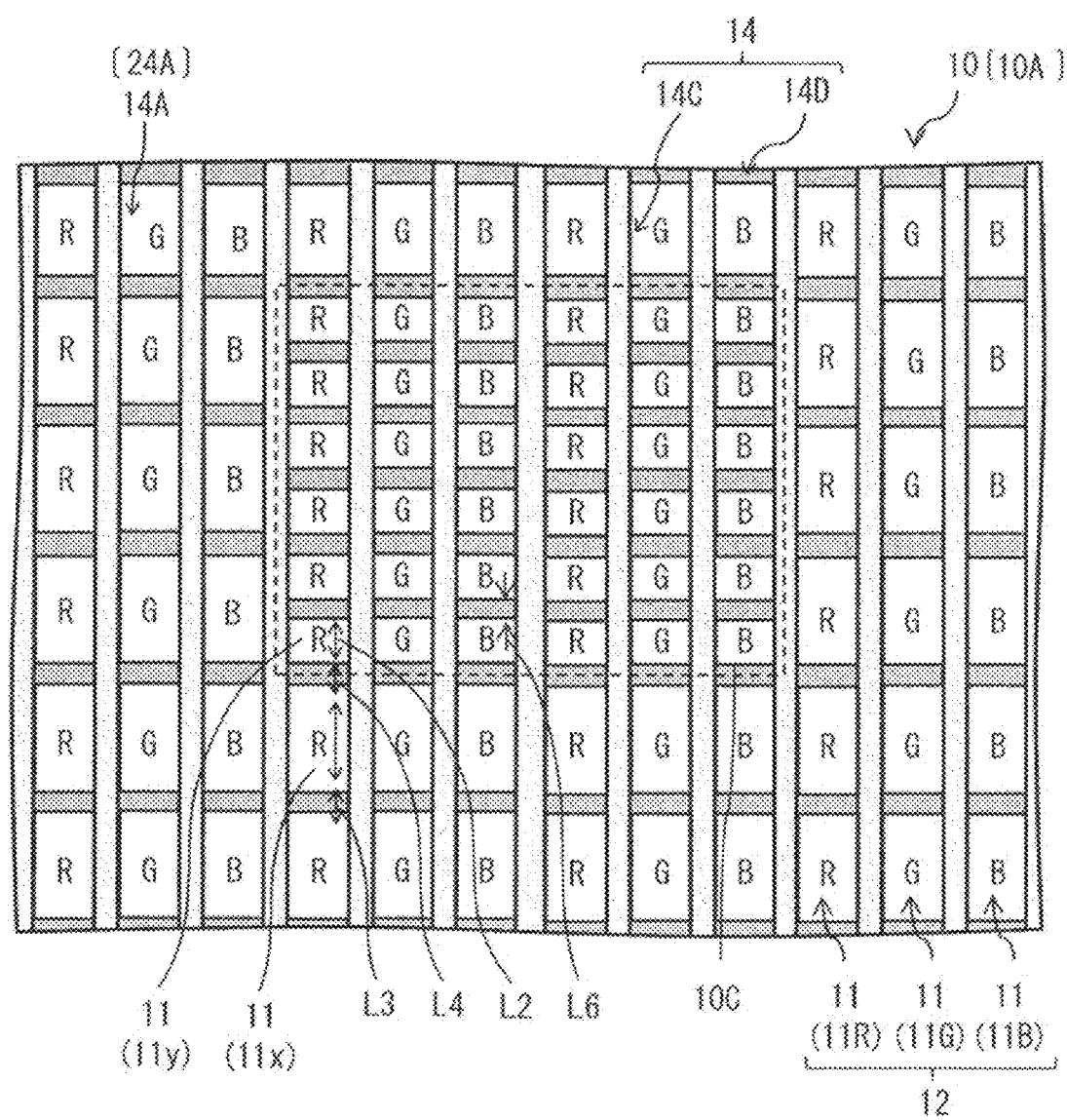
FIG. 18 is a diagram illustrating one modification example of a schematic configuration of the light-emitting panel in FIG. 1.

It is to be noted that in Modification Example A, the length L6 may be equal to the length L3 and the length L4 as illustrated in FIG. 18, for example. This makes it possible to increase an aperture ratio of each of the pixels 11 in a region of the display region 10A excluding the high-definition region 10C, as compared with the foregoing example embodiment.

Modification Example B

Figure 19:
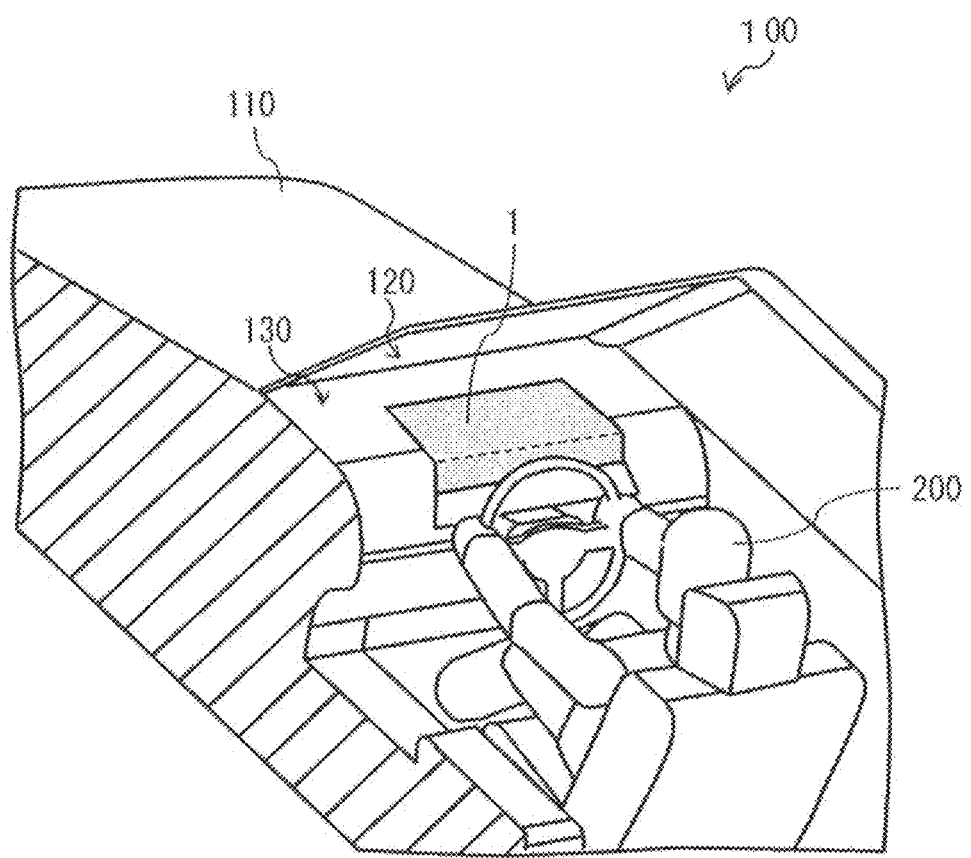
FIG. 19 is a diagram illustrating an example of a state where the light-emitting unit in FIG. 1 is mounted on a dashboard of a movable object.

FIG. 19 illustrates an example of a state where the light-emitting unit 1 (the light-emitting panel 10) according to any foregoing example embodiment or modification example of the disclosure is mounted on a dashboard 130 of a movable object 100. When driving the movable object 100, a driver 200 may visually observe a vehicle body 110 and a situation around the movable object 100 through a windshield 120. In this example, the driver 200 may give attention to various pieces of information (e.g., speed, temperature, and road maps) displayed on the dashboard 130 as needed while driving.

Figure 20:
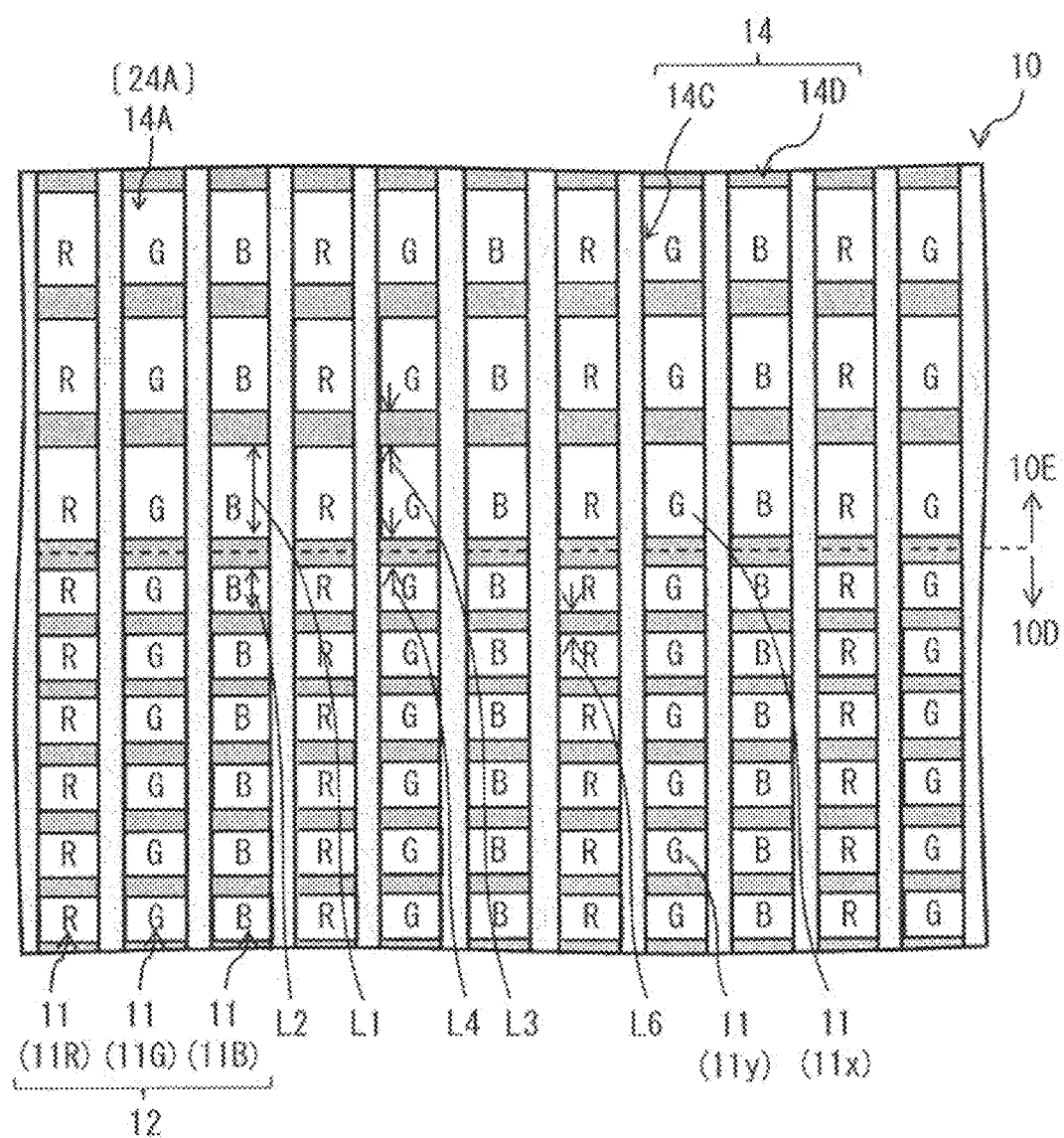
FIG. 20 is a diagram illustrating an example of a schematic configuration of a light-emitting panel in the light-emitting unit illustrated in FIG. 19.

Here, the light-emitting unit 1 (the light-emitting panel 10) may be disposed along a surface of the dashboard 130. In this example, the light-emitting panel 10 may be curved or bent, for example. As illustrated in FIG. 19, for example, a lower part of the light-emitting panel 10 may be a substantially parallel screen as seen from the driver 200, and an upper part of the light-emitting panel 10 may be a screen tilted forward obliquely as seen from the driver 200. In a case where the light-emitting unit 1 (the light-emitting panel 10) has such a convex shape as seen from the driver 200, the light-emitting panel 10 may include the second pixels 11y arranged in matrix in a lower part (vertical region 10D) of the light-emitting panel 10, and include the first pixels 11x arranged in matrix in an upper part (tilted region 10E) of the light-emitting panel 10, as illustrated in FIG. 20, for example. In this example, the vertical region 10D may be disposed closer to the driver 200 than the tilted region 10E is.

In this example, lengths L1 and L2 in the column direction of the first pixel 11x and the second pixel 11y may be set to cause a difference in apparent pixel size (area) between the first pixel 11x and the second pixel 11y when the light-emitting panel 10 is seen in a predetermined (or specific) direction to be smaller than a difference in actual pixel size (area) between the first pixel 11x and the second pixel 11y. In one example, the second pixels 11y may be disposed along the column regulators 14C in the vertical region 10D, and the first pixels 11x may be disposed along the column regulators 14C in the tilted region 10E.

In Modification Example B, a definition region (row regulator 14D) defining two of the first pixels 11x that are adjacent to each other in the column direction may have a length L3 that is larger than a length L6 of a definition region (row regulator 14D) defining two of the second pixels 11y that are adjacent to each other in the column direction. The length L3 may be equal to a length L4 of a definition region (row regulator 14D) defining the first pixel 11x and the second pixel 11y that are adjacent to each other in the column direction. This enables an appearance (reduction scale and definition) of an image on the vertical region 10D from the driver 200 to be equal to an appearance (reduction scale and definition) of an image on the tilted region 10E from the driver 200. Consequently, it is possible to improve visibility and display quality of the light-emitting unit 1 (the light-emitting panel 10) regardless of bending of the light-emitting panel 10.

Figure 21:
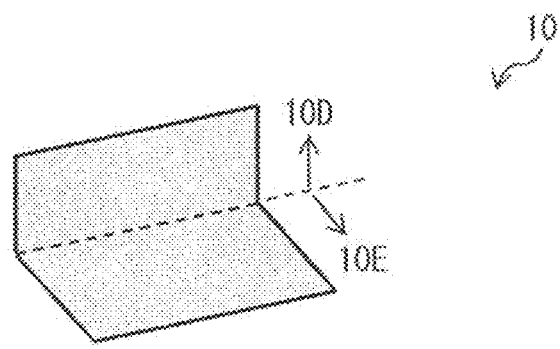
FIG. 21 is a diagram illustrating one modification example of the light-emitting panel in FIG. 19.

In another example, as illustrated in FIG. 21, a lower part of the light-emitting panel 10 may be a screen tilted forward obliquely as seen from the driver 200, and an upper part of the light-emitting panel 10 may be a substantially parallel screen as seen from the driver 200. In a case where the light-emitting panel 10 has such a concave shape as seen from the driver 200, the light-emitting panel 10 may include the first pixels 11x arranged in matrix in an upper part (vertical region 10D) of the light-emitting panel 10, and include the second pixels 11y arranged in matrix in a lower part (tilted region 10E) of the light-emitting panel 10, for example. This enables an appearance (reduction scale and definition) of an image on the vertical region 10D from the driver 200 to be equal to an appearance (reduction scale and definition) of an image on the tilted region 10E from the driver 200. Consequently, it is possible to improve visibility and display quality of the light-emitting panel 10 regardless of bending of the light-emitting panel 10.

Figure 22:
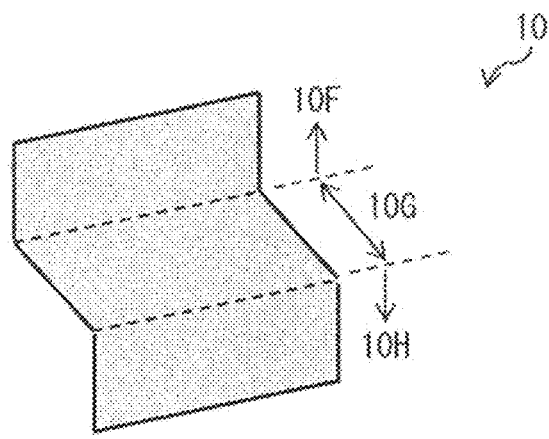
FIG. 22 is a diagram illustrating one modification example of the light-emitting panel in FIG. 19.
Figure 23:
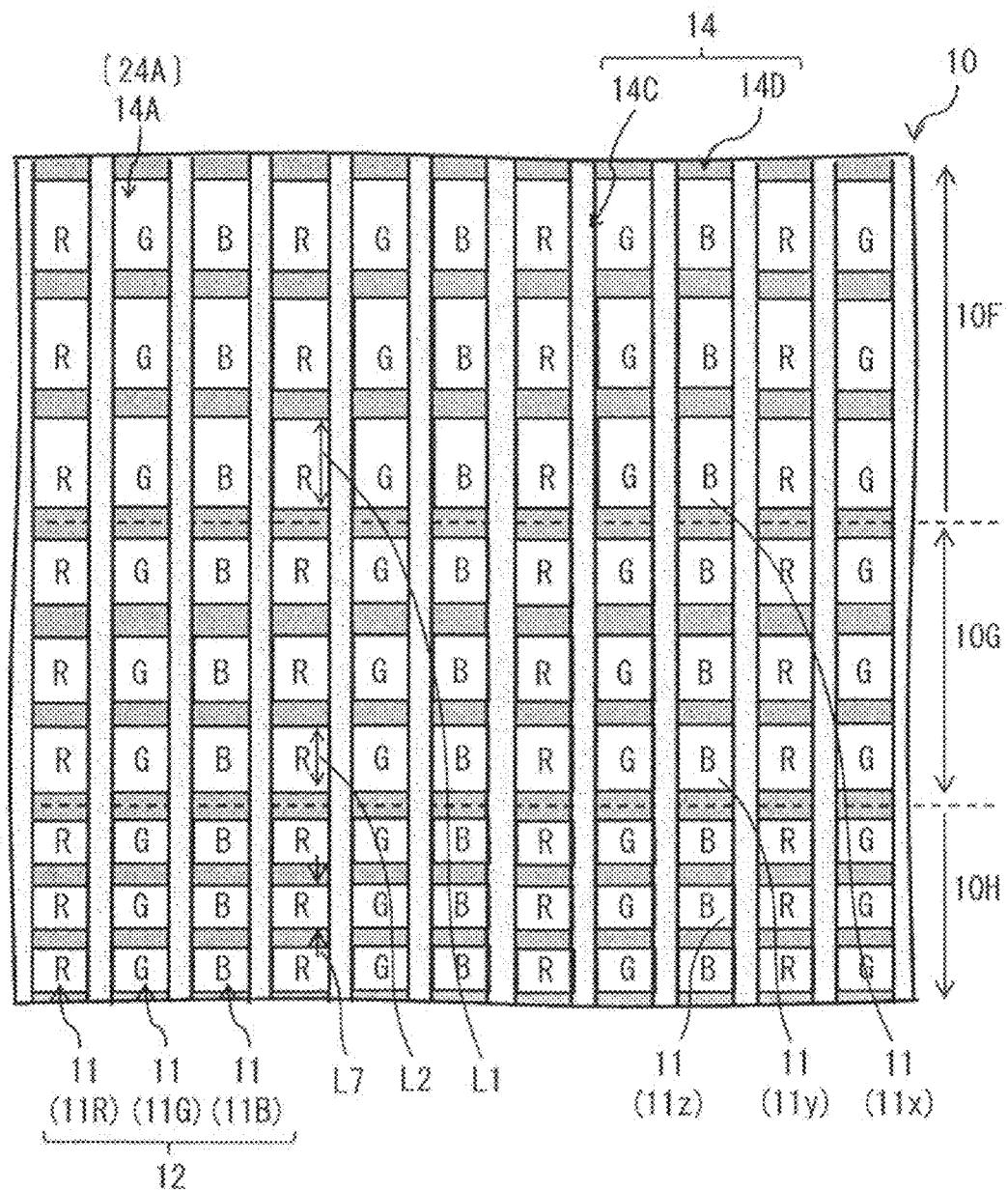
FIG. 23 is a diagram illustrating an example of a schematic configuration of the light-emitting panel in FIG. 22.

In still another example, as illustrated in FIG. 22, a lower part of the light-emitting panel 10 may be a substantially parallel screen as seen from the driver 200, a middle part of the light-emitting panel 10 may be a screen tilted forward obliquely as seen from the driver 200, and an upper part of the light-emitting panel 10 may be a substantially parallel screen as seen from the driver 200. In a case where the light-emitting panel 10 has such a crank shape as seen from the driver 200, the light-emitting panel 10 may include the first pixels 11x arranged in matrix in an upper part (upper region 10F) of the light-emitting panel 10, include the second pixels 11y arranged in matrix in a middle part (middle region 10G) of the light-emitting panel 10, and include third pixels 11z arranged in matrix in a lower part (lower region 10H) of the light-emitting panel 10, as illustrated in FIG. 23. The third pixels 11z may each have a length L7 in the column direction that is smaller than the length L2. In this example, the lower region 10H may be disposed closer to the driver 200 than the upper region 10F and the middle region 10G.

In this case, the first pixel 11x, the second pixel 11y, and the third pixel 11z may have different lengths L1, L2, and L7 in the column direction from each other. The length L2 in the column direction of the second pixel 11y may be smaller than the length L1 in the column direction of the first pixel 11x. The length L7 in the column direction of the third pixel 11z may be smaller than the length L2 in the column direction of the second pixel 11y. In other words, the pixels 11 in the display region 10A may include the pixels 11 (the first pixels 11x, the second pixels 11y, and the third pixels 11z) having different lengths L1, L2, and L7 in the column direction from each other. This enables an appearance of an image on the upper part (upper region 10F) of the light-emitting panel 10 from the driver 200, an appearance of an image on the middle part (middle region 10G) of the light-emitting panel 10 from the driver 200, and an appearance of an image on the lower part (lower region 10H) of the light-emitting panel 10 from the driver 200 to be equal to each other. Here, the appearance may include reduction scale and definition, for example. Consequently, it is possible to improve visibility and display quality of the light-emitting panel 10 regardless of bending of the light-emitting panel 10.

Figure 24:
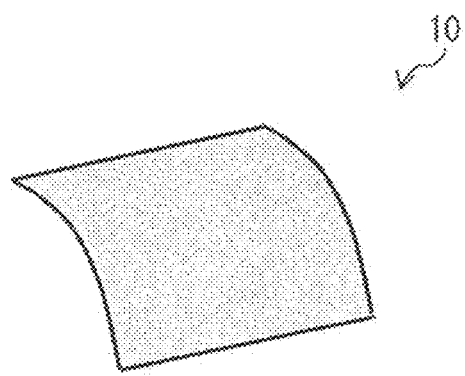
FIG. 24 is a diagram illustrating one modification example of the light-emitting panel in FIG. 19.
Figure 25:
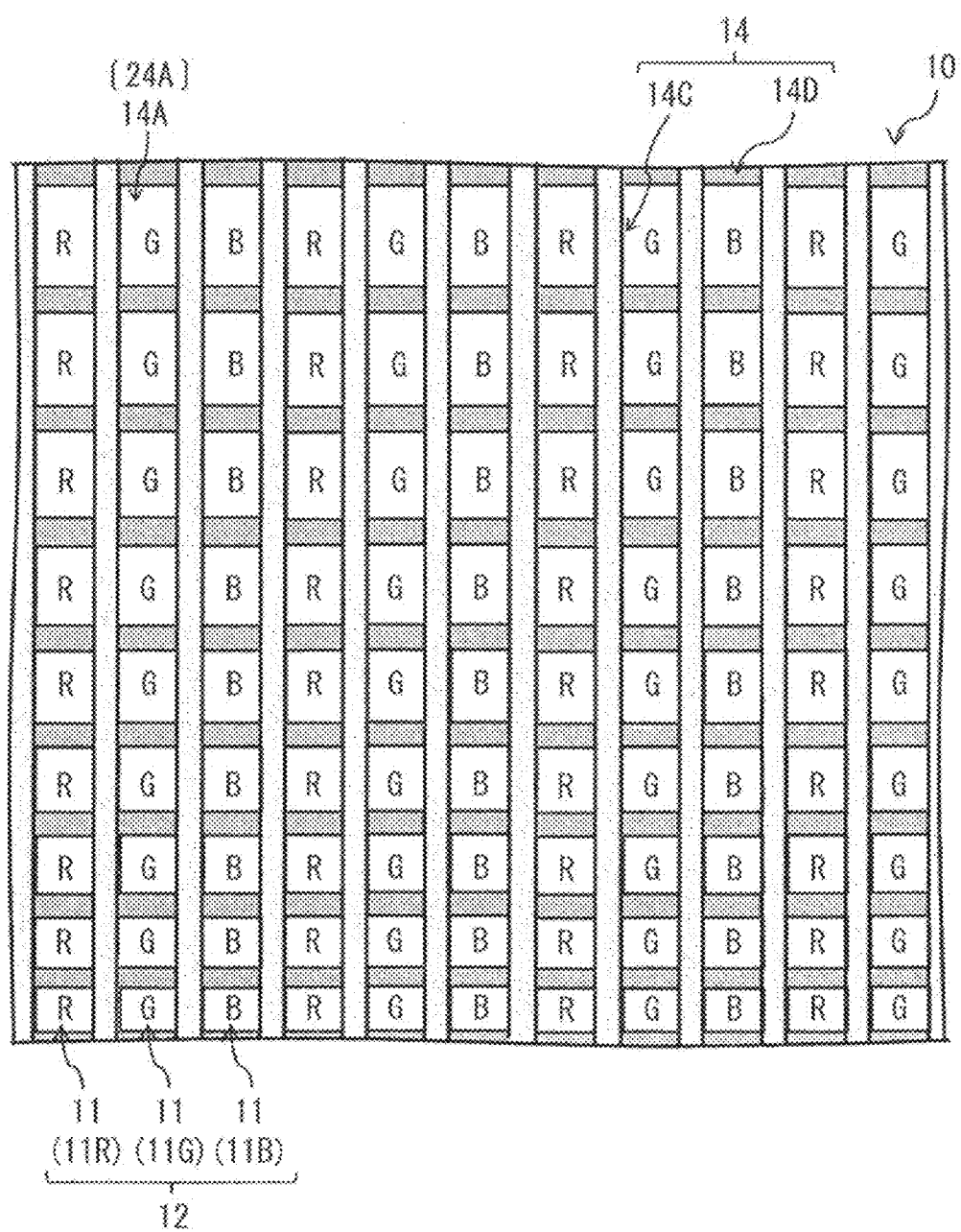
FIG. 25 is a diagram illustrating an example of a schematic configuration of the light-emitting panel in FIG. 24.

Note that the light-emitting panel 10 may be curved into a convex shape or a concave shape. For example, as illustrated in FIG. 24, the light-emitting panel 10 may have a forward tilt angle, as seen from the driver 200, that becomes larger from a lower part to an upper part of the light-emitting panel 10. In a case where the light-emitting panel 10 is curved into such a convex shape as seen from the driver 200, the pixels 11 in the light-emitting panel 10 may have a length in the column direction that becomes larger from a lower part to an upper part of the light-emitting panel 10 as seen from the driver 200, as illustrated in FIG. 25. This enables an appearance (reduction scale and definition) of an image on the entire light-emitting panel 10 from the driver 200 to be uniform. Consequently, it is possible to improve visibility and display quality of the light-emitting panel 10 regardless of bending of the light-emitting panel 10.

Modification Example C

Figure 26:
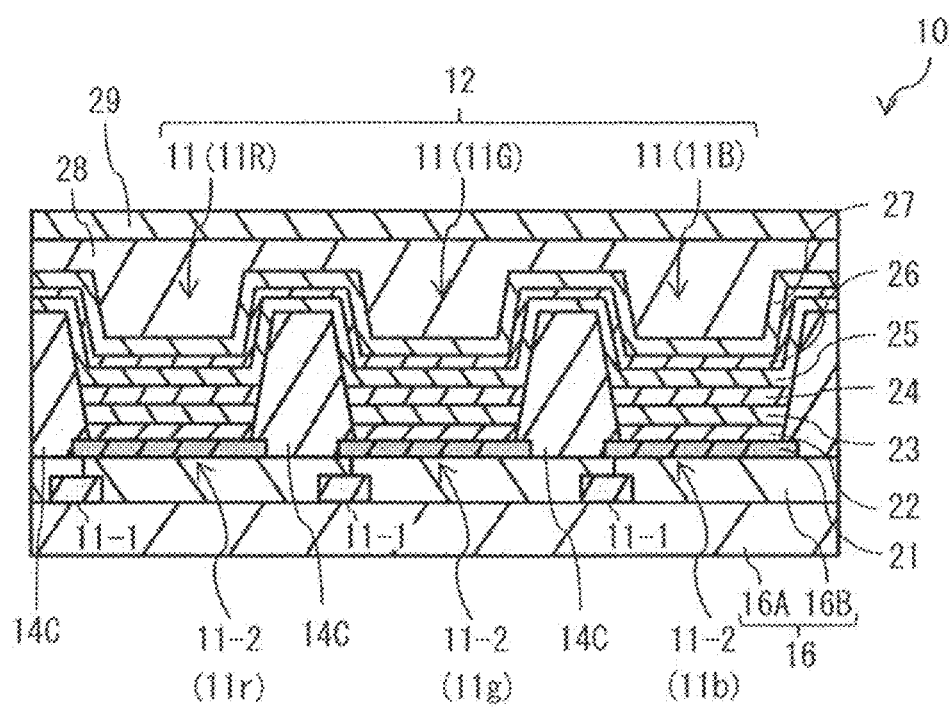
FIG. 26 is a diagram illustrating one modification example of a cross-sectional configuration of the light-emitting panel in any of FIGS. 3 to 12, 17, 18, and 20 to 25.

FIG. 26 illustrates one modification example of a cross-sectional configuration of the light-emitting panel 10 according to any foregoing example embodiment or modification example of the disclosure. The light-emitting panel 10 according to any foregoing example embodiment or modification example of the disclosure may include a circular polarization plate 29 on a display surface as illustrated in FIG. 26, for example. Providing the circular polarization plate 29 on the display surface makes it possible to prevent deterioration of visibility and display quality of the light-emitting panel 10 even in a case where, for example, the light-emitting panel 10 is used in an environment where external light enters.

Note that a color filter may be provided on the display surface, instead of the circular polarization plate 29. In addition, an anti-reflection film or an anti-glare film may be provided on the outermost surface. Alternatively, a laminated film including an anti-reflection film and an anti-glare film may be provided on the outermost surface. A touch panel may be further provided below the laminated film.

Modification Example D

In any foregoing example embodiment or modification example of the disclosure, the row regulator 14D may have a height (from the substrate 16) equal to a height (from the substrate 16) of the column regulator 14C. Alternatively, in any foregoing example embodiment or modification example of the disclosure, the row regulator 14D may have a height (from the substrate 16) larger than a height (from the substrate 16) of the column regulator 14C. In these cases, the surfaces of the column regulators 14C and the perimeter regulator 14E may have a liquid-repellent property relatively as compared with the surfaces of the row regulators 14D. The surfaces of the column regulators 14C and the perimeter regulator 14E may allow ink to spread on the surfaces of the column regulators 14C and the perimeter regulator 14E when, for example, the hole injection layer 22, the hole transport layer 23, and the light-emitting layer 24 are formed by a coating method.

Modification Example E

Figure 27:
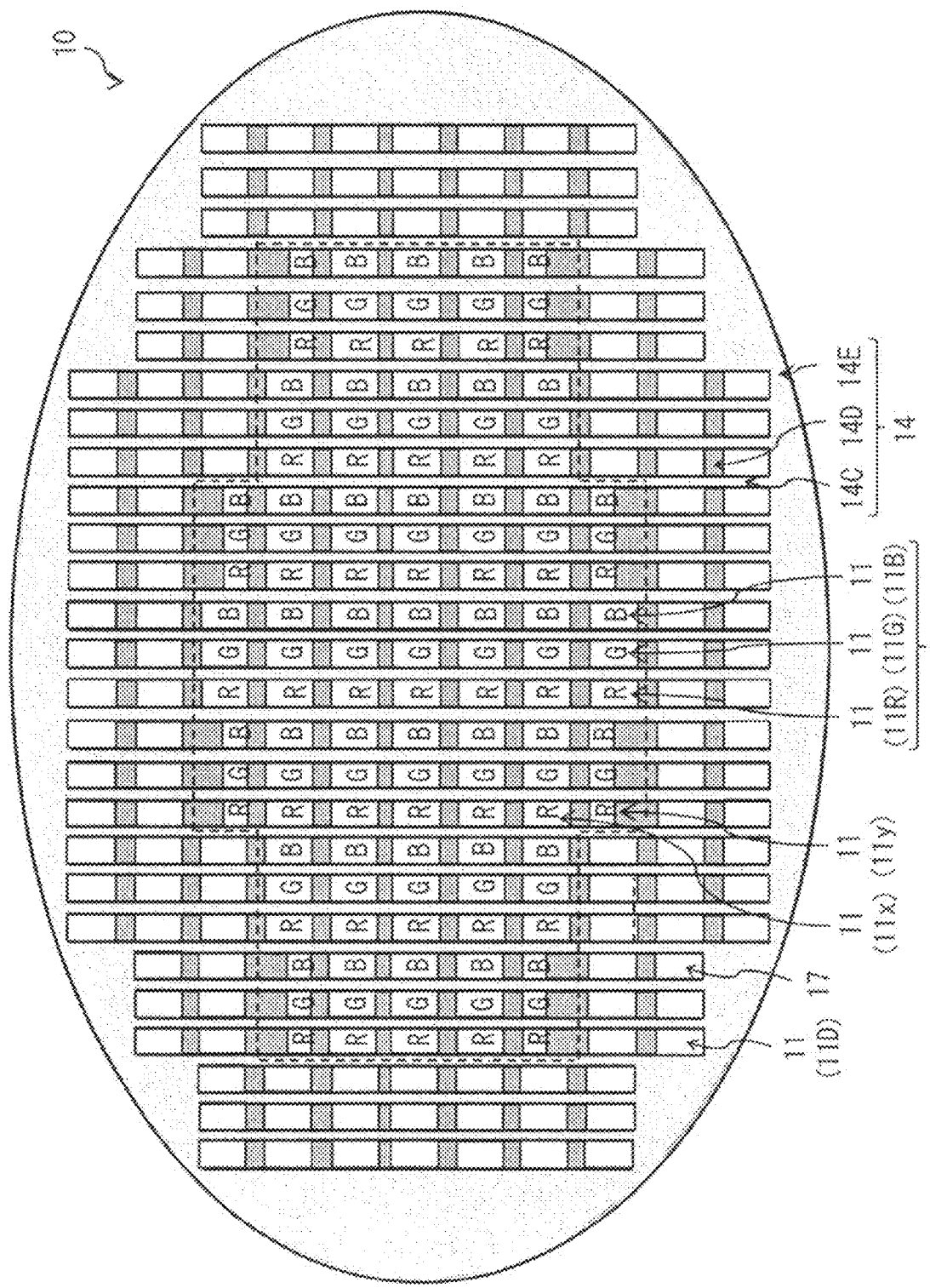
FIG. 27 is a diagram illustrating one modification example of a schematic configuration of the light-emitting panel in any of FIGS. 3 to 12, 17, 18, and 20 to 26.

FIG. 27 illustrates one modification example of a planar configuration of the light-emitting panel 10 according to any foregoing example embodiment or modification example of the disclosure. The number of the pixels 11 illustrated in FIG. 27 is a mere example, and the actual number of pixels may correspond to a display area desired for actual use. In any foregoing example embodiment or modification example of the disclosure, the light-emitting panel 10 may have an elliptical shape as illustrated in FIG. 27 in one example. In this example, the substrate 16 may have an elliptical shape. In another example, the light-emitting panel 10 may have a variety of shapes, such as a circular shape, a trapezoidal shape, or a circular shape with a notched portion. In this example, the substrate 16 may have a shape corresponding to the shape of the light-emitting panel 10. Moreover, in a case where the light-emitting panel 10 has a shape other than a rectangular shape, such as an elliptical shape, a circular shape, a trapezoidal shape, or a circular shape with a notched portion, the light-emitting panel 10 may be bent into a convex shape, a concave shape, or a crank shape as illustrated in FIG. 19, FIG. 21, or FIG. 22, for example, or may be curved into a convex shape as illustrated in FIG. 24, for example.

In any foregoing example embodiment or modification example of the disclosure, each of the pixels 11 may include an additional structure.

Modification Example F

In any foregoing example embodiment or modification example of the disclosure, the light-emitting element 11-2 may be a quantum dot light-emitting diode (QLED) element. A QLED element refers to, for example, an element in which the light-emitting layer 24 of the light-emitting element 11-2 includes an inorganic material, and the hole injection layer 22, the hole transport layer 23, the electron transport layer 25, and the electron injection layer 26 of the light-emitting element 11-2 include an organic material. Even in this case, it is possible to achieve effects similar to those of any foregoing example embodiment or modification example of the disclosure.

Modification Example G

In any foregoing example embodiment or modification example of the disclosure, the hole injection layer 22, the hole transport layer 23, the light-emitting layer 24, the electron transport layer 25, and the electron injection layer 26 may be formed by deposition instead of coating.

Now, any foregoing example embodiment or modification example of the disclosure is made on the assumption that a user sees the light emitting panel 10 obliquely in the column direction. One reason for this is that the light emitting panel 10 has a larger chromaticity viewing angle in the column direction than in the row direction. However, in any foregoing example embodiment or modification example of the disclosure, the user may see the light emitting panel 10 obliquely in the row direction as needed. A larger pixel width is able to be ensured in a longitudinal direction of a pixel in which the column regulator 14C extends than in a lateral direction of a pixel in which the row regulator 14D extends. This results in high design likelihood of luminance viewing angle characteristics and chromaticity viewing angle characteristics, enabling favorable viewing angle characteristics to be achieved. Accordingly, using the light-emitting panel 10 rotated 90° to cause a vertical direction of the light-emitting panel 10 to serve as the column direction of the light-emitting panel 10 makes it possible to improve viewing angles on opposite sides of the rotated panel.

Modification Example H

In any foregoing example embodiment or modification example of the disclosure, the electron transport layer 25 and the electron injection layer 26 may be individually provided for each of the display pixels 12 to be shared by the pixels 11 in the display pixel 12. In this case, the electron transport layer 25 and the electron injection layer 26 may be formed by, for example, mask deposition or coating.

Modification Example I

In any foregoing example embodiment or modification example of the disclosure, display pixels of two pixel sizes (i.e., the display pixels 12n and 12s) may be disposed at the boundary between the display region 10A and the non-display region 10B in the display region 10A. However, in any foregoing example embodiment or modification example of the disclosure, display pixels of three or more pixel sizes may be disposed at the boundary between the display region 10A and the non-display region 10B in the display region 10A.

In any foregoing example embodiment or modification example of the disclosure, rows and columns may be interchanged. For example, the column regulators 14C and the row regulators 14D may be interchanged in any foregoing example embodiment or modification example of the disclosure. In this case, the row regulator 14D may correspond to a specific but non-limiting example of a "first regulator" according to one embodiment of the disclosure. The column regulator 14C may correspond to a specific but non-limiting example of a "second regulator", a "third regulator", and a "fourth regulator" according to one embodiment of the disclosure.

Modification Example J

Figure 28:
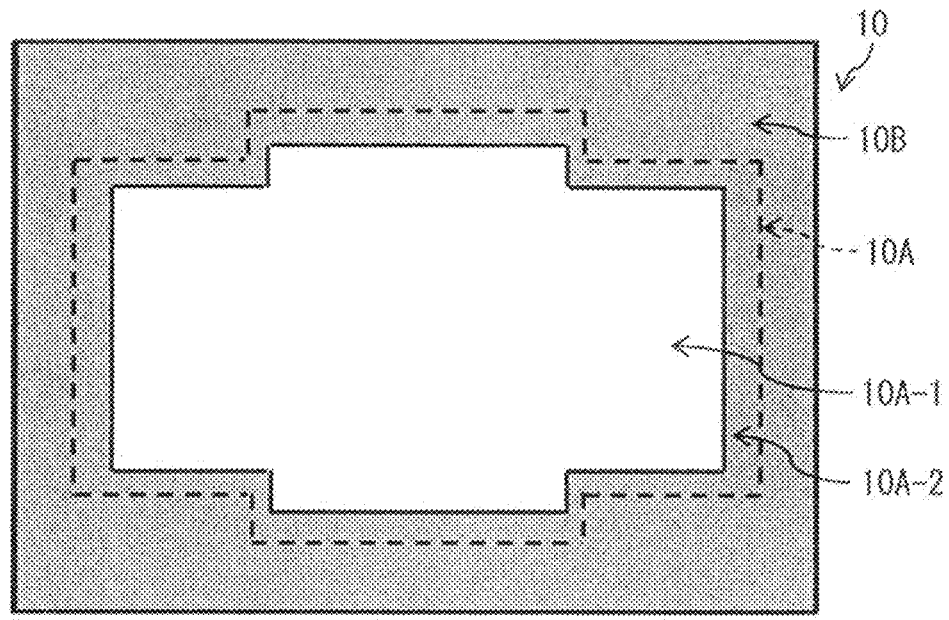
FIG. 28 is a diagram illustrating an example of a state where wobbling is performed in the light-emitting panel in FIG. 5 or FIG. 7.
Figure 29:
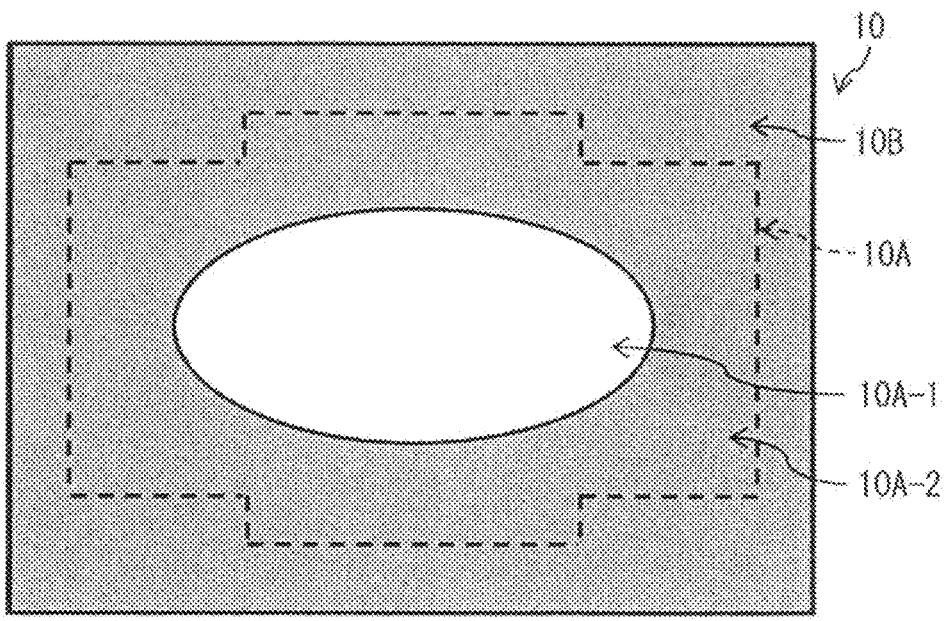
FIG. 29 is a diagram illustrating an example of a state where wobbling is performed in the light-emitting panel in FIG. 5 or FIG. 7.

In any foregoing example embodiment or modification example of the disclosure, wobbling may be performed to prevent burn-in. Wobbling means to move display by an amount corresponding to several pixels at regular time intervals. For example, in the display region 10A, a place corresponding to the outer edge may be a non-light-emitting region 10A-2, and a place corresponding to a region other than the outer edge may be a light-emitting region 10A-1, as illustrated in FIGS. 28 and 29. In this example, the light-emitting region 10A-1 may move by an amount corresponding to several pixels at regular time intervals in the display region 10A. In one example, the light-emitting region 10A-1 may have a shape similar to a shape of the display region 10A as illustrated in FIG. 28. In another example, the light-emitting region 10A-1 may have a shape, such as a circular or elliptical shape, different from the shape of the display region 10A as illustrated in FIG. 29.

Figure 30:
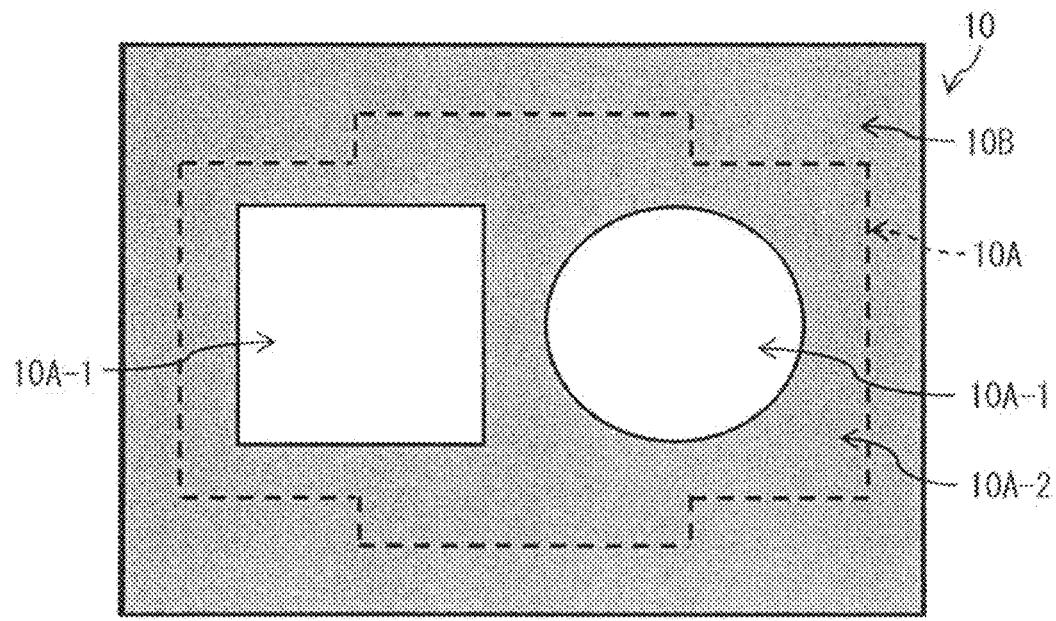
FIG. 30 is a diagram illustrating an example of a state where wobbling is performed in the light-emitting panel in FIG. 5 or FIG. 7.
Figure 31:
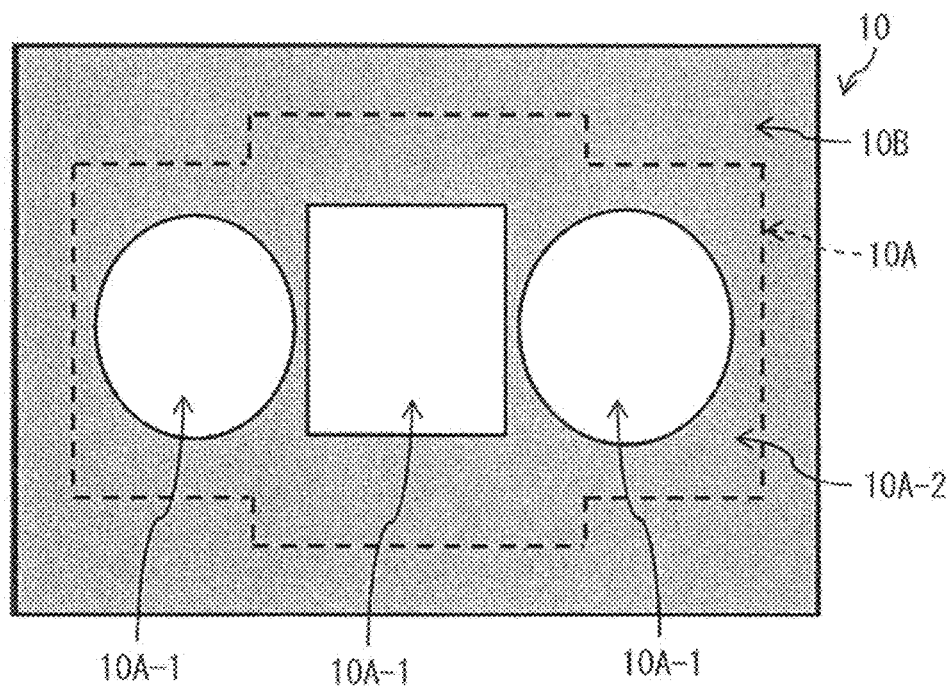
FIG. 31 is a diagram illustrating an example of a state where wobbling is performed in the light-emitting panel in FIG. 5 or FIG. 7.

In Modification Example J, the display region 10A may include two light-emitting regions 10A-1, for example, as illustrated in FIG. 30. In this case, in the display region 10A, each of the light-emitting regions 10A-1 may move by an amount corresponding to several pixels at regular time intervals. In this example, the two light-emitting regions 10A-1 may have different shapes. For example, one light-emitting region 10A-1 may have a circular or elliptical shape, and the other light-emitting region 10A-1 may have a rectangular shape. Alternatively, in Modification Example J, the display region 10A may include three light-emitting regions 10A-1, for example, as illustrated in FIG. 31. In this case, in the display region 10A, each of the light-emitting regions 10A-1 may move by an amount corresponding to several pixels at regular time intervals. In this example, the three light-emitting regions 10A-1 may have different shapes. For example, the first light-emitting region 10A-1 may have a circular or elliptical shape, the second light-emitting region 10A-1 may have a rectangular shape, and the third light-emitting region 10A-1 may have a circular or elliptical shape. It is to be noted that, although FIGS. 29 to 31 each illustrate a boundary line of the circle or ellipse of the light-emitting region 10A-1 as a curved line for convenience, the boundary line may actually have steps each corresponding to the size of the pixel 11.

In Modification Example J, the display region 10A may be provided with a plurality of light-emitting regions 10A-1. The light-emitting regions 10A-1 may move by an amount corresponding to several pixels at regular time intervals. This makes it possible to prevent burn-in.

In Modification Example J, the light-emitting region 10A-1 may have a shape corresponding to a shape of a display screen of an electronic apparatus to which the light-emitting panel 10 is applicable. In this case, wobbling need not be performed. In such a case where it is possible to change the shape of the light-emitting region 10A-1 to a shape corresponding to a shape of a display screen of an electronic apparatus to which the light-emitting panel 10 is applicable, there is no need to change the shape of the display region 10A for each electronic apparatus. This makes it possible to reduce manufacturing cost of the light-emitting panel 10.

3. APPLICATION EXAMPLES

Application Example 1

Described below is an application example of the light-emitting unit 1 according to any foregoing example embodiment or modification example of the disclosure. The light-emitting unit 1 is applicable to a variety of display units of electronic apparatuses that display images or pictures based on external or internal image signals. Specific but non-limiting examples of the electronic apparatuses may include television apparatuses, digital cameras, notebook personal computers, sheet-like personal computers, portable terminal devices such as mobile phones, vehicle-mounted display units, or vehicle-mounted monitors, and video cameras.

Figure 32:
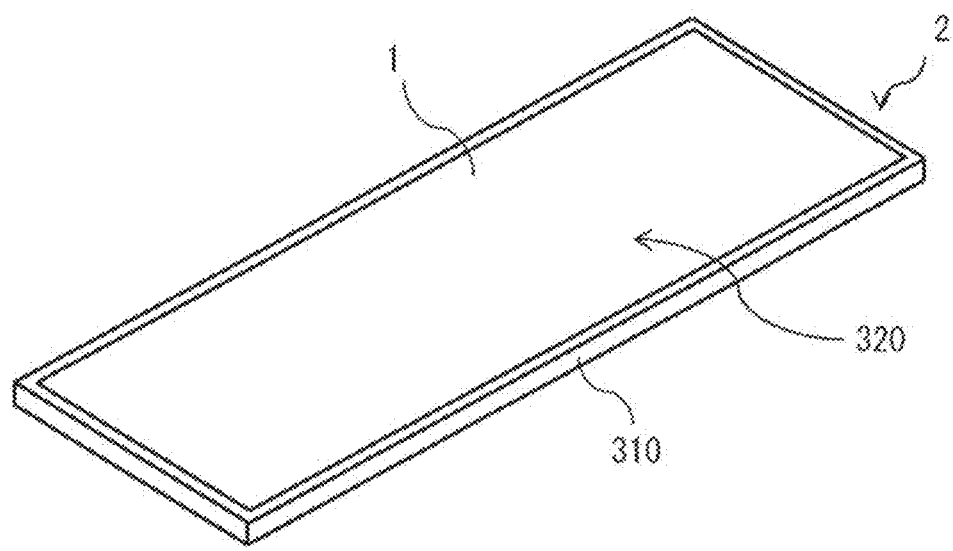
FIG. 32 is a perspective view of an example appearance of an electronic apparatus provided with the light-emitting unit according to one embodiment of the disclosure.

FIG. 32 is a perspective view of an electronic apparatus 2 having an example appearance according to Application Example 1. The electronic apparatus 2 may be, for example, a sheet-like personal computer that includes a body 310 having a display surface 320 on a main face. The light-emitting unit 1 according to any foregoing example embodiment or modification example of the disclosure may be provided as a display unit on the display surface 320 of the electronic apparatus 2. The light-emitting unit 1 may be disposed with the light-emitting panel 10 facing outward. The electronic apparatus 2 of Application Example 1, which includes the light-emitting unit 1 according to any foregoing example embodiment or modification example of the disclosure on the display surface 320, exhibits high visibility and display quality.

Application Example 2

Described below is an application example of the light-emitting element 11-2 according to any foregoing example embodiment or modification example of the disclosure. The light-emitting element 11-2 is applicable to a variety of light sources in illumination apparatuses for table lightings, or floor lightings, and room lightings.

Figure 33:
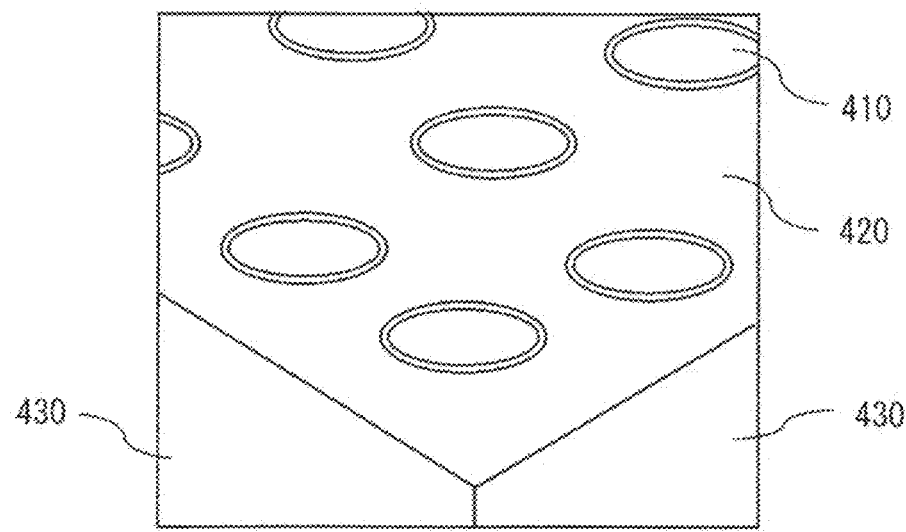
FIG. 33 is a perspective view of an example appearance of an illumination apparatus provided with the light-emitting element according to one embodiment of the disclosure.

FIG. 33 illustrates an example appearance of an illumination apparatus for a room lighting that is provided with the light-emitting unit 1 according to any foregoing example embodiment or modification example. The illumination apparatus may include, for example, illuminating sections 410 each including a light-emitting unit 1 according to any foregoing example embodiment or modification example. An appropriate number of the illuminating sections 410 are disposed at appropriate intervals on a ceiling 420. Note that the illuminating sections 410 may be installed on any place, such as a wall 430 or a non-illustrated floor, other than the ceiling 420, depending on the intended use.

The illumination apparatus may perform illumination with light emitted from the light-emitting unit 1 according to any foregoing example embodiment or modification example of the disclosure. This allows the illumination apparatus to exhibit high illumination quality.

Although the disclosure is described hereinabove with reference to the example embodiments and modification examples, these embodiments and modification examples are not to be construed as limiting the scope of the disclosure and may be modified in a wide variety of ways. It should be appreciated that the effects described herein are mere examples. Effects of an example embodiment and modification examples of the disclosure are not limited to those described herein. The disclosure may further include any effects other than those described herein.

It is possible to achieve at least the following configurations from the above-described example embodiments of the disclosure.

(1) A light-emitting panel including:
   a plurality of pixels;
   a plurality of first regulators that extends in a first direction and defines each two of the pixels that are adjacent to each other in a second direction orthogonal to the first direction; and
   a plurality of second regulators that extends in the second direction and defines each two of the pixels that are adjacent to each other in the first direction,
   the plurality of pixels at least including a first pixel and a second pixel that have different lengths in the first direction from each other and share a light-emitting layer,
   the first pixel and the second pixel at least being adjacent to each other in the first direction with the second regulator being interposed between the first pixel and the second pixel.

(2) The light-emitting panel according to (1), in which
   the plurality of pixels is grouped into display pixels each including predetermined number of the pixels,
   two of the display pixels that are adjacent to each other in the first direction include a first display pixel and a second display pixel,
   the first display pixel includes the first pixel, and
   the second display pixel includes the second pixel.

(3) The light-emitting panel according to (1) or (2), in which
   the first pixel and the second pixel are disposed in a gap between two of the first regulators that are adjacent to each other.

(4) The light-emitting panel according to (3), in which the first pixel and the second pixel are disposed along the first regulators.

(5) The light-emitting panel according to any one of (1) to (4), further including:
   a display region; and
   a non-display region provided around the display region,
   in which the first pixel and the second pixel are disposed in the display region,
   the length of the second pixel is smaller than the length of the first pixel in the first direction, and
   the second pixel is disposed at a boundary between the display region and the non-display region.

(6) The light-emitting panel according to (5), in which
   the plurality of second regulators includes a third regulator and a fourth regulator,
   the plurality of pixels further includes a third pixel disposed in the non-display region,
   the second pixel and the third pixel are adjacent to each other in the first direction with the third regulator being interposed between the second pixel and the third pixel, and
   a length of the third regulator is larger than a length of the fourth regulator in the first direction.

(7) The light-emitting panel according to any one of (1) to (4), in which
   the length of the second pixel is smaller than the length of the first pixel in the first direction,
   the first pixel includes a plurality of first pixels,
   the second pixel includes a plurality of second pixels, and
   the plurality of pixels includes the plurality of first pixels arranged along the first direction and the plurality of second pixels arranged along the first direction.

(8) The light-emitting panel according to (7), in which, in the first direction, a region defining two of the second pixels that are adjacent to each other in the first direction has a length that is smaller than a length of a region defining two of the first pixels that are adjacent to each other in the first direction.

(9) The light-emitting panel according to any one of (1) to (8), in which
   the light-emitting panel is curved or bent, and
   the lengths of the first pixel and the second pixel in the first direction are set to cause a difference in apparent pixel size, between the first pixel and the second pixel when the light-emitting panel is seen in a predetermined direction, to be smaller than a difference in actual pixel size between the first pixel and the second pixel.

(10) The light-emitting panel according to any one of (1) to (4), further including:
   a display region; and
   a non-display region provided around the display region,
   in which at least the first pixel and the second pixel are disposed in the display region,
   the plurality of pixels further includes at least a third pixel disposed in the non-display region, and
   the third pixel is at least adjacent to the first pixel or the second pixel in the first direction, with the second regulator being interposed between the third pixel and the first pixel or the second pixel.

(11) The light-emitting panel according to any one of (1) to (10), in which the light-emitting layer includes a coating film.

(12) The light-emitting panel according to (11), in which the first pixel and the second pixel share another layer including a coating film, in addition to the light-emitting layer.

(13) The light-emitting panel according to (10), in which the third pixel shares the light-emitting layer with the first pixel or the second pixel.

(14) The light-emitting panel according to (13), in which the third pixel shares, with the first pixel or the second pixel, another layer including a coating film, in addition to the light-emitting layer.

(15) The light-emitting panel according to any one of (1) to (14), in which the second regulator has a lyophilic property relatively as compared with the first regulator.

(16) The light-emitting panel according to any one of (1) to (15), in which the second regulator has a height smaller than a height of the first regulator.

(17) An electronic apparatus including the light-emitting panel according to any one of (1) to (16).

(18) A method of manufacturing a light-emitting panel, the method including:
   preparing a panel including
   a display region,
   a non-display region provided around the display region,
   a plurality of pixel formation regions provided in both the display region and the non-display region, a plurality of first regulators that extends in a first direction and defines each two of the pixel formation regions that are adjacent to each other in a second direction orthogonal to the first direction, and a plurality of second regulators that extends in the second direction and defines each two of the pixel formation regions that are adjacent to each other in the first direction, the plurality of pixel formation regions including a first pixel and a second pixel that have different lengths in the first direction from each other, the first pixel and the second pixel being adjacent to each other in the first direction with the second regulator being interposed between the first pixel and the second pixel; and forming a pixel including a light-emitting layer in the pixel formation regions included in the display region and the pixel formation regions included in the non-display region, by applying ink to the display region and the non-display region of the panel.

(19) The method of manufacturing the light-emitting panel according to (18), in which the pixel including the light-emitting layer is formed in the pixel formation regions included in the display region and the pixel formation regions included in the non-display region, by applying the ink to a region of the non-display region in which no pixel formation region is formed yet, the plurality of pixel formation regions in the non-display region, and the plurality of pixel formation regions in the display region.

(20) The method of manufacturing the light-emitting panel according to (18) or (19), in which the second regulator has a lyophilic property to the ink, relatively as compared with the first regulator.

(21) The method of manufacturing the light-emitting panel according to any one of (18) to (20), in which the second regulator has a height smaller than a height of the first regulator.

(22) The light-emitting panel according to (12), in which the second regulator allows ink to spread on a surface of the second regulator when the light-emitting layer is formed by a coating method.

(23) An electronic apparatus including:

a light-emitting panel; and a driving circuit that drives the light-emitting panel, the light-emitting panel including a plurality of pixels, a plurality of first regulators that extends in a first direction and defines each two of the pixels adjacent in a second direction orthogonal to the first direction, and a plurality of second regulators that extends in the second direction and defines each two of the pixels adjacent in the first direction, the plurality of pixels including a first pixel and a second pixel that have different lengths in the first direction and share a light-emitting layer, the first pixel and the second pixel being adjacent in the first direction via the second regulator, the second regulator having a height smaller than a height of the first regulator.

The light-emitting panel and the electronic apparatus according to one embodiment of the disclosure include the first pixel and the second pixel that differ from each other in length in the first direction and share the light-emitting layer. Thus, for example, when the light-emitting layer of the first pixel and the second pixel is formed by a coating method, ink containing the material of the light-emitting layer communicates between the first pixel and the second pixel via the second regulator. This enables the light-emitting layer to have a uniform thickness regardless of sizes of the first pixel and the second pixel.

The method of manufacturing the light-emitting panel according to one embodiment of the disclosure forms the pixel including the light-emitting layer in the pixel formation regions included in the display region and the pixel formation regions included in the non-display region, by applying the ink to the display region and the non-display region of the panel. This enables the light-emitting layer to have a uniform thickness, regardless of the sizes of the first pixel and the second pixel.

The light-emitting panel, the electronic apparatus, and the method of manufacturing the light-emitting panel according to one embodiment of the disclosure enable the light-emitting layer to have a uniform thickness, regardless of the sizes of the first pixel and the second pixel. This makes it possible to reduce display unevenness such as luminance unevenness. Note that effects of the example embodiment of the disclosure are not limited to the effect described hereinabove, and may be any effect described herein.

Although the disclosure is described hereinabove in terms of example embodiments and modification examples, it is not limited thereto. It should be appreciated that variations may be made in the example embodiments and modification examples described herein by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc., are used to distinguish one element from another. The term "disposed on/provided on/formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. A light-emitting panel comprising:

a display region;

a non-display region provided around the display region;

a plurality of pixels;

a plurality of first regulators, each of which extends in a first direction and defines each two of the pixels that are adjacent to each other in a second direction orthogonal to the first direction; and a plurality of second regulators, each of which extends in the second direction and defines each two of the pixels that are adjacent to each other in the first direction, wherein the plurality of pixels at least include a first pixel and a second pixel that have different lengths in the first direction from each other and share a light-emitting layer, the first pixel and the second pixel are adjacent to each other in the first direction with one of the plurality of second regulators being interposed between the first pixel and the second pixel, the first pixel and the second pixel are disposed in the display region, the length of the second pixel is smaller than the length of the first pixel in the first direction, the second pixel is disposed at a boundary between the display region and the non-display region, the plurality of second regulators includes a third regulator and a fourth regulator, the plurality of pixels further includes a third pixel disposed in the non-display region, the second pixel and the third pixel are adjacent to each other in the first direction with the third regulator being interposed between the second pixel and the third pixel, a length of the third regulator is larger than a length of the fourth regulator in the first direction, the plurality of first regulators and the plurality of second regulators extend from a substrate, and each of the plurality of the second regulators has a height smaller than a height of each of the plurality of first regulators.

2. The light-emitting panel according to claim 1, wherein the plurality of pixels is grouped into display pixels each including predetermined number of the pixels, two of the display pixels that are adjacent to each other in the first direction include a first display pixel and a second display pixel, the first display pixel includes the first pixel, and the second display pixel includes the second pixel.

3. The light-emitting panel according to claim 1, wherein the first pixel and the second pixel are disposed in a gap between two of the first regulators that are adjacent to each other.

4. The light-emitting panel according to claim 3, wherein the first pixel and the second pixel are disposed along the first regulators.

5. The light-emitting panel according to claim 1, wherein the plurality of pixels further include at least a third pixel disposed in the non-display region, and the third pixel is at least adjacent to the first pixel or the second pixel in the first direction, with another of the plurality of second regulators being interposed between the third pixel and the first pixel or the second pixel.

6. The light-emitting panel according to claim 1, wherein the light-emitting layer comprises a coating film.

7. The light-emitting panel according to claim 6, wherein the first pixel and the second pixel share another layer including a coating film, in addition to the light-emitting layer.

8. The light-emitting panel according to claim 5, wherein the third pixel shares the light-emitting layer with the first pixel or the second pixel.

9. The light-emitting panel according to claim 8, wherein the third pixel shares, with the first pixel or the second pixel, another layer including a coating film, in addition to the light-emitting layer.

10. The light-emitting panel according to claim 1, wherein the second regulator has a lyophilic property relatively as compared with the first regulator.

11. An electronic apparatus comprising the light-emitting panel according to claim 1.

12. The light-emitting panel according to claim 1, wherein the substrate is provided with a planarization film.

13. The light-emitting panel according to claim 1, wherein the plurality of first regulators and the plurality of second regulators extend from the substrate except for areas where the plurality of first regulators and the plurality of second regulators cross from a plan view of the light-emitting panel.

* * * * *